United States Patent
Chen et al.

(10) Patent No.: US 10,718,676 B2
(45) Date of Patent: Jul. 21, 2020

(54) PRESSURE SENSING ELECTRONIC DEVICE, METHODS OF FORMING AND OPERATING THE SAME

(71) Applicant: NANYANG TECHNOLOGICAL UNIVERSITY, Singapore (SG)

(72) Inventors: Xiaodong Chen, Singapore (SG); Bowen Zhu, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 137 days.

(21) Appl. No.: 15/778,614

(22) PCT Filed: Nov. 23, 2016

(86) PCT No.: PCT/SG2016/050576
§ 371 (c)(1),
(2) Date: May 23, 2018

(87) PCT Pub. No.: WO2017/091151
PCT Pub. Date: Jun. 1, 2017

(65) Prior Publication Data
US 2018/0292279 A1    Oct. 11, 2018

(30) Foreign Application Priority Data

Nov. 25, 2015  (SG) .......................... 10201509694W

(51) Int. Cl.
*G01L 5/22* (2006.01)
*H01L 45/00* (2006.01)
(Continued)

(52) U.S. Cl.
CPC .............. *G01L 5/228* (2013.01); *G01L 1/205* (2013.01); *G06F 3/016* (2013.01);
(Continued)

(58) Field of Classification Search
CPC ......... G01L 5/228; G01L 1/205; G01L 1/146; H01L 45/04; H01L 45/1233;
(Continued)

(56) References Cited

U.S. PATENT DOCUMENTS 8,094,481 B2 * 1/2012 Katoh ....................... G11C 8/08
                                                                   365/100
8,988,927 B2 * 3/2015 Nazarian ............ G11C 14/0045
                                                                   365/148
(Continued)

FOREIGN PATENT DOCUMENTS

JP    2011-96784 A    5/2011
JP    2013-68563 A    4/2013

OTHER PUBLICATIONS

Bauer, "Sophisticated skin," *Nature Materials* 12:871-872, 2013.
(Continued)

*Primary Examiner* — Jonathan M Dunlap
(74) *Attorney, Agent, or Firm* — Seed Intellectual Property Law Group LLP

(57) ABSTRACT

Various embodiments may provide a pressure sensing electronic device. The electronic device may include a tactile sensor configured to determine an external pressure. The electronic device may also include a memory device electrically coupled to the tactile sensor. The memory device may be configured to switch from a first state to a second state upon the external pressure determined by the tactile sensor exceeding a predetermined threshold when a writing current flows through the tactile sensor and the memory device.

18 Claims, 32 Drawing Sheets

(51) Int. Cl.
 H01L 27/24 (2006.01)
 H03K 17/96 (2006.01)
 G01L 1/20 (2006.01)
 G06F 3/01 (2006.01)
(52) U.S. Cl.
 CPC .......... *H01L 27/2463* (2013.01); *H01L 45/04* (2013.01); *H01L 45/1233* (2013.01); *H01L 45/145* (2013.01); *H03K 17/9625* (2013.01)
(58) Field of Classification Search
 CPC ... H01L 45/145; H01L 27/2463; G06F 3/016; H03K 17/9625
 See application file for complete search history.

(56) References Cited

U.S. PATENT DOCUMENTS

| | | | | |
|---|---|---|---|---|
| 9,024,286 B2* | 5/2015 | Liu | H01L 27/2472 | 257/4 |
| 9,112,058 B2 | 8/2015 | Bao et al. | | |
| 9,281,415 B2* | 3/2016 | Bao | H01L 29/84 | |
| 9,361,975 B2* | 6/2016 | Gilbert | G11C 13/004 | |
| 9,496,494 B2* | 11/2016 | Jeon | H01L 45/04 | |
| 9,677,952 B2* | 6/2017 | Bao | H01L 29/84 | |
| 2010/0110767 A1* | 5/2010 | Katoh | G11C 8/08 | 365/148 |
| 2011/0287392 A1* | 11/2011 | Al-Tawil | A61F 4/00 | 434/112 |
| 2012/0062245 A1* | 3/2012 | Bao | H01L 29/84 | 324/661 |
| 2012/0075241 A1* | 3/2012 | Bao | H01L 29/84 | 345/174 |
| 2012/0241710 A1* | 9/2012 | Liu | H01L 27/2472 | 257/4 |
| 2014/0077148 A1* | 3/2014 | Liu | H01L 27/2472 | 257/4 |
| 2014/0151623 A1 | 6/2014 | Jeon et al. | | |
| 2014/0254238 A1* | 9/2014 | Gilbert | G11C 13/004 | 365/148 |
| 2014/0327470 A1* | 11/2014 | Nazarian | H03K 19/17764 | 326/38 |
| 2015/0325788 A1* | 11/2015 | Hashim | G11C 13/0007 | 438/382 |
| 2016/0041652 A1* | 2/2016 | Bao | H01L 29/84 | 345/174 |
| 2016/0187209 A1* | 6/2016 | Bao | H01L 29/84 | 73/862.626 |
| 2018/0026184 A1* | 1/2018 | Kwon | H01L 27/115 | 257/4 |

OTHER PUBLICATIONS

Cavallini et al., "Regenerable Resistive Switching in Silicon Oxide Based Nanojunctions," *Adv. Mater.* 24:1197-1201, 2012.
Choong et al., "Highly Stretchable Resistive Pressure Sensors Using a Conductive Elastomeric Composite on a Micropyramid Array," *Adv. Mater.* 26:3451-3458, 2014.
Dahiya et al., "Tactile Sensing—From Humans to Humanoids," *IEEE Transactions on Robotics* 26(1): 2010, 20 pages.
Fan et al., "Transparent Triboelectric Nanogenerators and Self-Powered Pressure Sensors Based on Micropatterned Plastic Films," *Nano Letters* 12(6):3109-3114, 2012.
Gong et al., "A wearable and highly sensitive pressure sensor with ultrathin gold nanowires," *Nature Communications* 5: 2014, 8 pages.
Gong et al., "Highly Stretchy Black Gold E-Skin Nanopatches as Highly Sensitive Wearable Biomedical Sensors," *Adv., Electron. Mater.* 1: 2015, 7 pages.
Gong et al., "Tattoolike Polyaniline Microparticle-Doped Gold Nanowire Patches as Highly Durable Wearable Sensors," *ACS Appl. Mater. Interfaces* 7:19700-19708, 2015.

Hammock et al., "25th Anniversary Article: The Evolution of Electronic Skin (E-Skin): A Brief History, Design Considerations, and Recent Progress," *Adv. Mater.* 25:5997-6038, 2013.
Ho et al., "Tunable strain gauges based on two-dimensional silver nanowire networks," *Nanotechnology* 26: 2015, 9 pages.
Jo et al., "Nanoscale Memristor Device as Synapse in Neuromorphic Systems," *Nano Lett.* 10:1297-1301, 2010.
Johansson et al., "Coding and use of tactile signals from the fingertips in object manipulation tasks," *Nature Reviews* 10:345-359, 2009.
Joo et al., "Silver nanowire-embedded PDMS with a multiscale structure for a highly sensitive and robust flexible pressure sensor," *Nanoscale* 7:6208-6215, 2015.
Kaltenbrunner et al., "An ultra-lightweight design for imperceptible plastic electronics," *Nature* 499:458-463, 2013, 9 pages.
Kanao et al., "All Solution-Processed Flexible Memory Integrated with Tactile Sensor," *IEEE 29th International Conference on Micro Electro Mechanical Systems*, Shanghai, China, Jan. 24-28, 2016, 4 pages.
Kim et al., "Flexible Crossbar-Structured Resistive Memory Arrays on Plastic Substrates via Inorganic-Based Laser Lift-Off," *Adv. Mater.* 26:7480-7487, 2014.
Kim et al., "Highly Sensitive and Stretchable Multidimensional Strain Sensor with Prestrained Anisotropic Metal Nanowire Percolation Networks," *Nano Lett.* 15:5240-5247, 2015.
Kim et al., "Stretchable silicon nanoribbon electronics for skin prosthesis," *Nature Communications* 5: 2014, 11 pages.
Lipomi et al., "Skin-like pressure and strain sensors based on transparent elastic films of carbon nanotubes," *Nature Nanotechnology* 6:788-792, 2011.
Liu et al., "Thickness-Gradient Films for High Gauge Factor Stretchable Strain Sensors," *Adv. Mater.* 27:6230-6237, 2015.
Lucarotti et al., "Synthetic and Bio-Artificial Tactile Sensing: A Review," *Sensors* 13:1435-1466, 2013.
Maheshwari et al., "High-Resolution Thin-Film Device to Sense Texture by Touch," *Science* 312:1501-1504, 2006 (5 pages).
Maheshwari et al., "Tactile Devices to Sense Touch on a Par with a Human Finger," *Angew. Chem. Int. Ed.* 47:7808-7826, 2008.
Mannsfeld et al., "Highly sensitive flexible pressure sensors with microstructured rubber dielectric layers," *Nature Materials* 9:859-864, 2010.
Meng et al., "Orthogonally modulated molecular transport junctions for resettable electronic logic gates," *Nature Communications* 5: 2014, 9 pages.
Meng et al., "Protein-Based Memristive Nanodevices," *Small* 7(21):3016-3020, 2011.
Pan et al., "An ultra-sensitive resistive pressure sensor based on hollow-sphere microstructure induced elasticity in conducting polymer film," *Nature Communications* 5: 2014, 8 pages.
Pan et al., "High-resolution electroluminescent imaging of pressure distribution using a piezoelectric nanowire LED array," *Nature Photonics* 7:752-758, 2013.
Pang et al., "A flexible and highly sensitive strain-gauge sensor using reversible interlocking of nanofibers," *Nature Materials* 11:795-801, 2012.
Persano et al., "High performance piezoelectric devices based on aligned arrays of nanofibers of poly(vinylidenefluoride-co-trifluoroethylene)," *Nature Communications* 4: 2013, 10 pages.
Qi et al., "Highly Stretchable Gold Nanobelts with Sinusoidal Structures for Recording Electrocorticograms," *Adv. Mater.* 20:3145-3151, 2015.
Schwartz et al., "Flexible polymer transistors with high pressure sensitivity for application in electronic skin and health monitoring," *Nature Communications* 4: 2013, 8 pages.
Sekitani et al., "Organic Nonvolatile Memory Transistors for Flexible Sensor Arrays," *Science* 326:1516-1519, 2009 (with supporting material, 23 pages).
Shao et al., "High-Performance and Tailorable Pressure Sensor Based on Ultrathin Conductive Polymer Film," *Small* 10(8):1466-1472, 2014.
Sokolov et al., "Chemical and Engineering Approaches to Enable Organic Field-Effect Transistors for Electronic Skin Applications," *Accounts of Chemical Research* 45(3):361-371, 2012.

(56) References Cited

OTHER PUBLICATIONS

Someya et al., "A large-area, flexible pressure sensor matrix with organic field-effect transistors for artificial skin applications," *PNAS* 101(27):9966-9970, 2004.

Someya et al., "Conformable, flexible, large-area networks of pressure and thermal sensors with organic transistor active matrixes," *PNAS* 102(35):12321-12325, 2005.

Su et al., "Mimosa-Inspired Design of a Flexible Pressure Sensor with Touch Sensitivity," *Small* 11(16):1886-1891, 2015.

Takahashi et al., "Carbon Nanotube Active-Matrix Backplanes for Conformal Electronics and Sensors," *Nano Lett.* 11:5408-5413, 2011.

Tee et al., "An electrically and mechanically self-healing composite with pressure- and flexion-sensitive properties for electronic skin applications," *Nature Nanotechnology* 7:825-832, 2012.

Wang et al., "A Mechanically and Electrically Self-Healing Supercapacitor," *Adv. Mater.* 26:3638-3643, 2014.

Wang et al., "Configurable Resistive Switching between Memory and Threshold Characteristics for Protein-Based Devices," *Adv. Funct. Mater.* 25:3825-3831, 2015.

Wang et al., "Recent Progress in Electronic Skin," *Adv. Sci.* 2: 2015, 21 pages.

Wang et al., "Resistive Switching Memory Devices Based on Proteins," *Adv. Mater.* 27(46):7670-7676, 2015.

Wang et al., "Sericin for Resistance Switching Device with Multilevel Nonvolatile Memory," *Adv. Mater.* 25(38):5498-5503, 2013.

Wang et al., "Silk-Molded Flexible, Ultrasensitive, and Highly Stable Electronic Skin for Monitoring Human Physiological Signals," *Adv. Mater.* 26:1336-1342, 2014.

Wang et al., "User-interactive electronic skin for instantaneous pressure visualization," *Nature Materials* 12:899-904, 2013.

Waser et al., "Nanoionics-based resistive switching memories," *Nature Materials* 6:833-840, 2007.

Waser et al., "Redox-Based Resistive Switching Memories—Nanoionic Mechanisms, Prospects, and Challenges," *Adv. Mater.* 21:2632-2663, 2009.

Wong et al., "Memory leads the way to better computing," *Nature Nanotechnology* 10:191-194, 2015.

Wu et al., "Taxel-Addressable Matrix of Vertical-Nanowire Piezotronic Transistors for Active and Adaptive Tactile Imaging," *Science* 340:952-957, 2013.

Xu et al., "Highly Conductive and Stretchable Silver Nanowire Conductors," *Adv. Mater.* 24:5117-5122, 2012.

Yamada et al., "A stretchable carbon nanotube strain sensor for human-motion detection," *Nature Nanotechnology* 6:296-301, 2011.

Yang et al., "Memristive devices for computing," *Nature Nanotechnology* 8:13-24, 2013 (13 pages).

Yao et al., "A Flexible and Highly Pressure-Sensitive Graphene—Polyurethane Sponge Based on Fractured Microstructure Design," *Adv. Mater.* 25(46):6692-6698, 2013.

Yao et al., "Wearable multifunctional sensors using printed stretchable conductors made of silver nanowires," *Nanoscale* 6:2345-2352, 2014.

Zang et al., "Flexible suspended gate organic thin-film transistors for ultra-sensitive pressure detection," *Nature Communications* 6: 2015, 9 pages.

Zhu et al., "Microstructured Graphene Arrays for Highly Sensitive Flexible Tactile Sensors," *Small* 10(18):3625-3631, 2014.

\* cited by examiner

FIG. 3

300 form a tactile sensor configured to determine an external pressure — 302 form a haptic memory device electrically coupled to the tactile sensor — 304

FIG. 4

400 apply an external pressure to a tactile sensor comprised in the pressure sensing device, the tactile sensor configured to determine the external pressure

402 apply a writing current to the electronic device including the tactile sensor and a memory device electrically coupled to the tactile sensor so that the memory device switches from a first state to a second state upon the external pressure determined by the tactile sensor exceeding a predetermined threshold

| Types of sensors | Sensitive layers | Sensitivity (kPa$^{-1}$) | Response time | Working voltage | Reference |
|---|---|---|---|---|---|
| OFET | Pressure-sensitive rubber | 0.05 | - | $V_{ds} = 20$ V | [1] |
| | Microstructured PDMS | 8.4 | <10 ms | $V_{ds} = 100$ V | [2] |
| | suspended gate OTFTs | 192 | 10 ms | - | [3] |
| Piezoelectric sensor | piezoelectric nanowire LED array | - | 90 ms | - | [4] |
| Capacitive sensor | Microstructured PDMS | 0.55 | - | - | [5] |
| | Carbon nanotubes/PDMS | 2.3 × 10$^{-4}$ | <125 ms | - | [6] |
| Resistive sensor | AuNWs coated tissue paper | >1.14 | <17 ms | 1.5 V | [7] |
| | Polypyrrole (PPy) hollow-sphere structures | 133.1 | <50 ms | - | [8] |
| | Graphene-polyurethane sponge | 0.26 | - | 1 V | [9] |
| | SWNT/PDMS | 1.8 | - | 2 V | [10] |
| | Mimosa leaflet patterned Au/PDMS | 50.17 | <20 ms | 10 mV | [11] |
| | PEDOT:PSS/polyurethane composite polymer | 10.3 | - | 0.2 V | [12] |
| | Microstructured graphene arrays | 5.5 | 0.2 ms | 1 V | [13] |
| | Microstructured AuNWs/PDMS | 24.8 | <4 ms | 1 V | This work |

1000c

1000d

PRESSURE SENSING ELECTRONIC DEVICE, METHODS OF FORMING AND OPERATING THE SAME

CROSS-REFERENCE TO RELATED APPLICATION

This application claims the benefit of priority of Singapore application No. 10201509694W, filed Nov. 25, 2015, the contents of it being hereby incorporated by reference in its entirety for all purposes.

BACKGROUND

Technical Field

Various aspects of this disclosure relate to pressure sensing electronic devices. Various aspects of this disclosure also relates to methods of forming and operating pressure sensing electronic devices.

Description of the Related Art

Sensory memory refers to the retention of sensations of interaction by the human body with external stimuli after the external stimuli cease, thus helping humans to describe or quantify physical interactions with the environment, and to manipulate objects in daily activities.

Haptic memory is one of the five forms of sensory memory that renders human capability of remembering the pressure/force stimuli applied on the skin, and helps humans to recognize the surrounding environment and conduct daily activities.

The skin is the largest organ in the human body and includes a variety of sensory receptors for providing significant sensation information such as force, pain, shape and texture. The skin perceives external stimuli and conveys the sensory information to the brain through afferent neurons to form haptic memory, allowing humans to remember the impressions of the stimuli applied on the skin. FIG. 1 is a schematic showing a perspective cross-sectional view of the skin 100 including the dermis 102a and epidermis 102b. An applied pressure is sensed by sensory receptors 104 present in the skin 100, and is conveyed to the brain by nerves 106.

The recent decade has witnessed significant advancements in the design and integration of electronic skin (E-skin) devices in order to emulate the exquisite tactile sensation of natural skin. One area relates to improved sensitivity of tactile sensors in low-pressure regimes. A tremendous improvement in sensitivity for tactile sensing has been achieved with the introduction of micro- and nano-structures. In addition, flexible tactile sensors with multiple sensing units having a variety of intriguing properties are able to achieve multi-functionality for mimicking the multiple sensing capabilities of natural skin.

However, although current high performance tactile sensing devices have moved towards mimicking or even surpassing the sensation function of natural skin, current tactile sensing devices are still unable to fully mimic the skin in other areas.

BRIEF SUMMARY

Various embodiments may provide a pressure sensing electronic device. The electronic device may include a tactile sensor configured to determine an external pressure. The electronic device may also include a memory device electrically coupled to the tactile sensor. The memory device may be configured to switch from a first state to a second state upon the external pressure determined by the tactile sensor exceeding a predetermined threshold when a writing current flows through the tactile sensor and the memory device.

Various embodiments may provide a method of forming a pressure sensing electronic device. The method may include forming a tactile sensor configured to determine an external pressure. The method may also include forming a memory device electrically coupled to the tactile sensor. The memory device may be configured to switch from a first state to a second state upon the external pressure determined by the tactile sensor exceeding a predetermined threshold when a writing current flows through the tactile sensor and the memory device.

Various embodiments may provide a method of operating a pressure sensing electronic device. The method may include applying an external pressure to a tactile sensor comprised in the pressure sensing device, the tactile sensor configured to determine the external pressure. The method may also include applying a writing current to the electronic device including the tactile sensor and a memory device electrically coupled to the tactile sensor so that the memory device switches from a first state to a second state upon the external pressure determined by the tactile sensor exceeding a predetermined threshold.

BRIEF DESCRIPTION OF THE SEVERAL VIEWS OF THE DRAWINGS

The invention will be better understood with reference to the detailed description when considered in conjunction with the non-limiting examples and the accompanying drawings, in which:

FIG. 3 is a schematic showing a method of forming a pressure sensing electronic device according to various embodiments.

FIG. 4 is a schematic showing a method of operating a pressure sensing electronic device according to various embodiments.

FIG. 7 shows a comparison table of the performance of one implementation or embodiment of a flexible pressure sensor (labeled as this work) with conventional pressure sensors.

DETAILED DESCRIPTION

Figure 1:
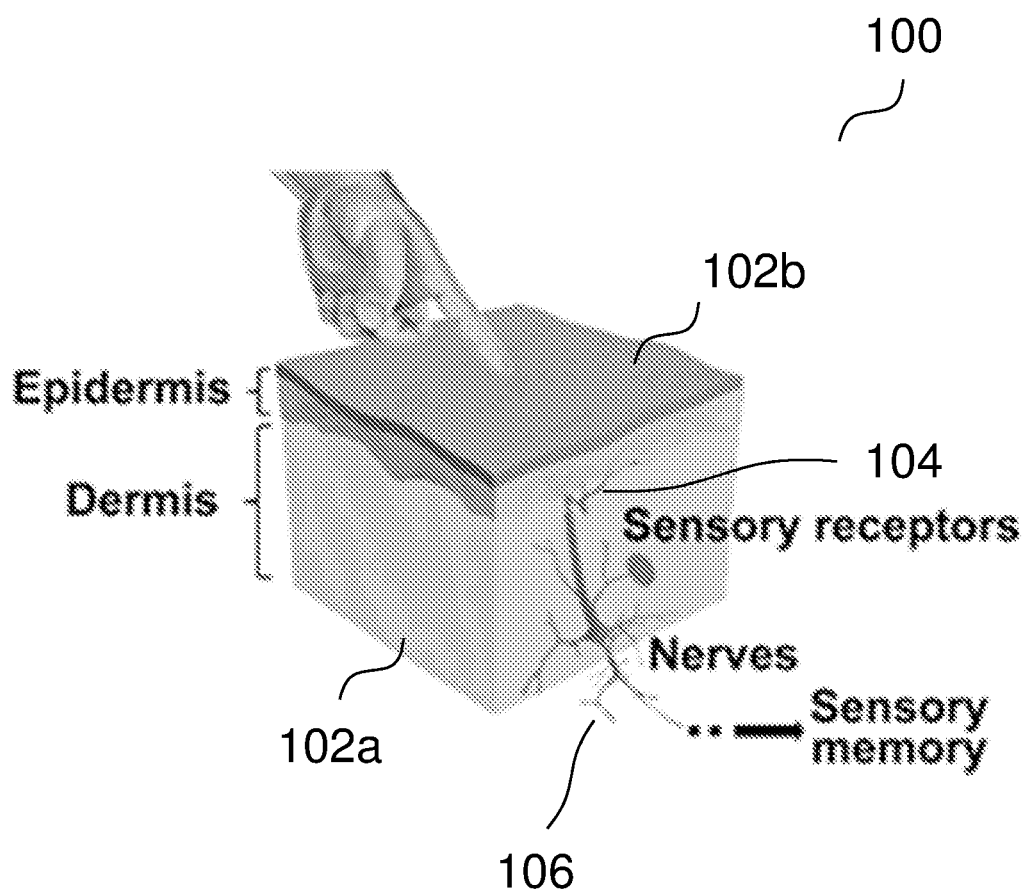
FIG. 1 is a schematic showing a perspective cross-sectional view of the skin including the dermis and epidermis.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on," e.g., in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

The electronic device as described herein may be operable in various orientations, and thus it should be understood that the terms "top," "bottom," etc., when used in the following description are used for convenience and to aid understanding of relative positions or directions, and not intended to limit the orientation of the electronic device.

In the context of various embodiments, the articles "a," "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Current tactile devices are unable to retain the sensation information after removal of the external stimuli. Various embodiments seek to address this issue. Various embodiments seek to close or reduce the gap between E-skin devices and the skin. Various embodiments relate to an electronic device such as an haptic memory device for the mimicry of haptic memory in natural skin.

It may be significant to devise skin-like haptic memory devices for next generation consumer electronics, artificial intelligence, invasive biomedical diagnosis and wearable healthcare applications, which require not only high performance flexible tactile sensors to detect and convert external stimuli to electrical signals, and also configurable memory devices to record such signals to mimic the haptic memory of human.

Figure 2:
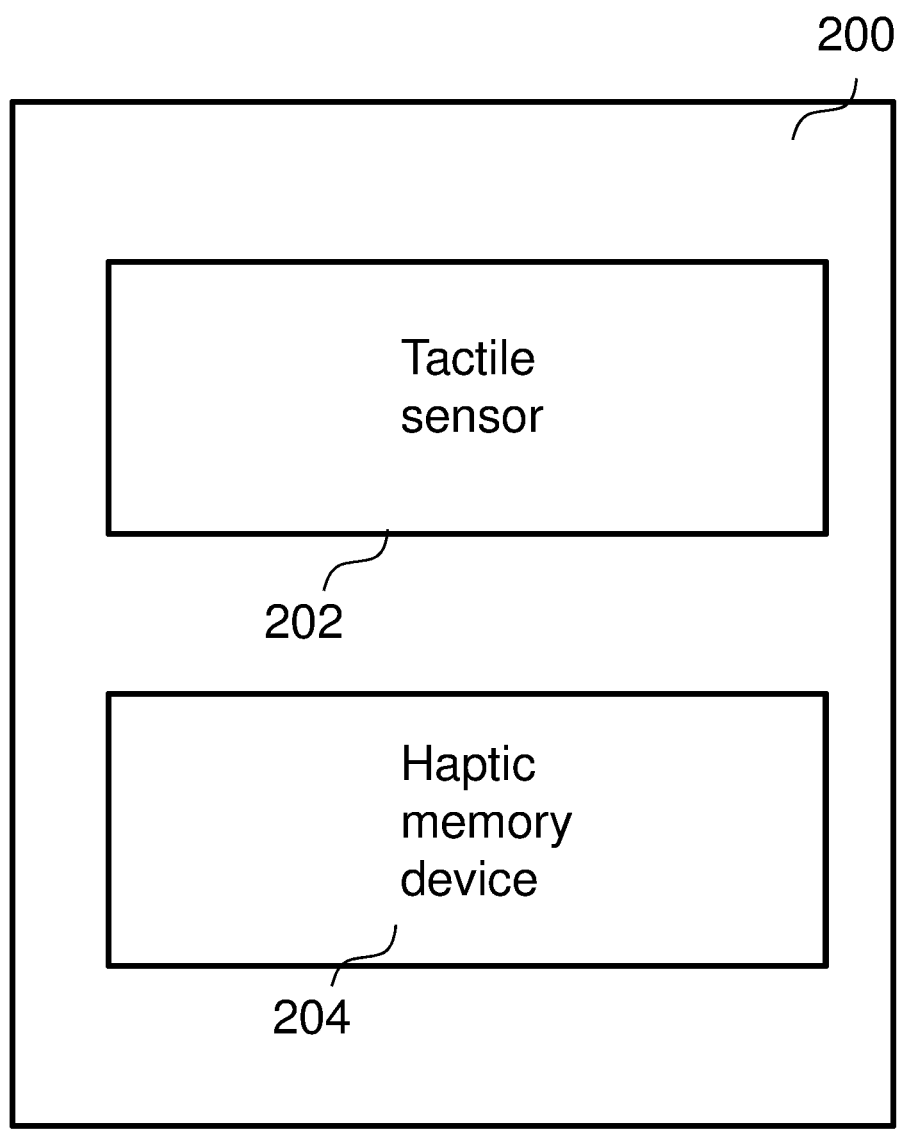
FIG. 2 is a schematic illustrating a pressure sensing electronic device according to various embodiments.

FIG. 2 is a schematic illustrating a pressure sensing electronic device 200 according to various embodiments. The electronic device 200 may include a tactile sensor 202 configured to determine an external pressure. The electronic device 200 may also include a memory device 204 electrically coupled to the tactile sensor 202. The memory device 204 may be configured to switch from a first state to a second state upon the external pressure determined by the tactile sensor 202 exceeding a predetermined threshold when a writing current flows through the tactile sensor 202 and the memory device 204.

In other words, an electronic device 200 which switches from one state to another by application of an external pressure may be provided. The device 200 includes a tactile sensor 202 for sensing the external pressure, and a memory device 204 which is switched upon the external pressure exceeding a certain threshold in the presence of a writing voltage flowing through the tactile sensor 202 and the memory device 204.

To mimic the haptic memory of human, electronic devices 200 according to various embodiments may include: 1) a high performance tactile sensors 202 for detection in the low pressure regime; and 2) memory devices 204 that may preserve the sensation information.

Most recent developments in tactile sensing devices may relate to improving sensitivity or functionality to address high sensing performance, not relating to retention of the sensation information after removal of the external stimuli. Various embodiments may provide pressure sensing electronic devices 200 for sensing and for retention of the sensation information after removal of the external stimuli.

The pressure sensing electronic device 200 may be referred to as a haptic memory device or a haptic memory or a haptic memory apparatus.

In various embodiments, the memory device 204 may be or may include a resistive memory device/cell such as resistive random access memory (RRAM).

A tactile sensor 202 may be referred to as a pressure sensor.

The tactile sensor 202 may be serially connected or coupled to the memory device 204. In other words, the tactile sensor 202 and the memory device 204 are connected in series.

The electronic device 200 may further include an electrical source configured to apply the writing current through the resistive tactile sensor 202 and the memory device 204. The electrical source may be electrically coupled or connected to the tactile sensor 202 and the memory device 204. The potential difference across the memory device 204 may be required to exceed a predetermined value ($V_{prog}$) before the writing current flows through the memory device 204. In other words, the writing current may be applied when a potential difference across the memory device 204 exceeds a predetermined value.

For example, a first end of the electrical source may be connected to a first end of the tactile sensor 202. A second end of the tactile sensor 202 may be connected to a first end of the memory device 204. A second end of the memory device 204 may be connected to a second end of the electrical source.

In various embodiments, the tactile sensor 202 may be a resistive tactile sensor or resistive pressure sensor having a resistance based on or dependent on the external pressure. The external pressure may be applied to the tactile sensor 202. The tactile sensor 202 may reflect the loading or unloading of the applied external pressure by a change in the resistance of the tactile sensor 202. In various embodiments, tactile sensor 202 may be configured so that the resistance of the tactile sensor 202 decreases with increasing applied external pressure. The resistance of the resistive tactile sensor 202 may decrease upon application of the external pressure on the resistive tactile sensor, thereby causing an increase in the writing current through the resistive tactile sensor 202 and the memory device 204.

The memory device 204 may be configured to switch from the first state to the second state upon the writing current flowing through the resistive tactile sensor and the memory device exceeding a predetermined value. In various embodiments, the predetermined value may be any value selected from a range from 50 nA to 0.1 mA. The current may exceed 1 mA when the memory device 204 is at the second state. The writing current may exceed the predetermined value when the external pressure determined by the tactile sensor exceeds the predetermined threshold. In various embodiments, the predetermined threshold may be any value in a range from 0 pascal (Pa) to 500 pascals (Pa). The predetermined threshold may be 0 pascals (Pa).

The first state may be a high resistance state, while the second state may be a low resistance state. In other words, the memory device 204 may have a higher resistance in the first state than in the second state. The memory device 204 may initially be in the first state or high resistance state. When the writing current is increased when the external pressure is applied to the resistive tactile sensor 202, conductive filaments may be formed in the memory device 204 (i.e., memory layer of the memory device 204) due to the increased writing current, and the memory device 204 may be switched the second state or low resistance state due to the presence of the conductive filaments.

The memory device 204 may include a memory layer. The memory layer may also be referred to as a switching layer. The memory device 204 may also include a first electrode layer in contact with a first side of the memory layer, and a second electrode layer in contact with a second side of the memory layer opposite the first side of the memory layer. The memory device 204 may be or may include a vertically stacked arrangement.

In various embodiments, the memory layer may include any type of material selected from a group consisting of metal oxides, semiconductor oxides, biomaterials, carbon materials, and combination thereof. In various embodiments, the first electrode layer and/or the second electrode layer may include any type of electrically conductive material such as metals, admixture metals, conductive metal oxides, conductive polymers, or conductive carbon materials (e.g., graphene, carbon nanotubes). In various embodiments, the memory layer may include silicon oxide ($SiO_2$), the first electrode layer may include gold (Au), and the second electrode layer may include silver (Ag).

In various embodiments, the second electrode layer of the memory device 204 may also be an electrode layer of the tactile sensor 202. In other words, the tactile sensor 202 and the memory device 204 may have or share a common electrode layer.

The tactile sensor 202 may further include a pressure sensing layer in contact with the second electrode layer. The pressure sensing layer may be electrically conductive. The pressure sensing layer may act as or be an electrode of the tactile sensor 202.

In various embodiments, the pressure sensing layer may include a plurality of microstructures. The plurality of microstructures may be pyramidal or conical or of any other suitable shape. The plurality of microstructures may also be micro-/nano-pillars, microspheres, or nanowires. In other words, each microstructure may be a pyramid, a cone, a pillar, a sphere or a wire. The pressure sensing layer may include any type of material selected from a group consisting of metal nanowires, conducting polymers, carbon nanotubes, graphene, and combinations thereof.

In various embodiments, the pressure sensing layer may include a substrate or matrix, e.g., a substrate or matrix including polydimethylsiloxane (PDMS). The pressure sensing layer may further include silver nanowires embedded in the substrate or matrix. Alternatively or additionally, the pressure sensing layer may include any suitable nanostructures in the substrate or matrix. The substrate or matrix, with the nanostructures embedded in the substrate or matrix may be patterned to form the plurality of microstructures.

Various embodiments may provide a pressure sensing electronic array including a plurality of pressure sensing electronic devices. Each pressure sensing electronic device may be or may form one cell of the pressure sensing electronic array.

FIG. 3 is a schematic 300 showing a method of forming a pressure sensing electronic device according to various embodiments. The method may include, in 302, forming a tactile sensor configured to determine an external pressure. The method may also include, in 304, forming a memory device electrically coupled to the tactile sensor. The memory device may be configured to switch from a first state to a second state upon the external pressure determined by the tactile sensor exceeding a predetermined threshold when a writing current flows through the tactile sensor and the memory device.

In other words, a method of forming a pressure sensing device as described herein may be provided. The method may include forming or providing a tactile sensor, and forming or providing a memory device, which is electrically connected to the tactile sensor. The memory device may switch from a first state to a second state when an external pressure is applied to the tactile sensor in the presence of a writing current passing through the tactile sensor and the memory device.

In various embodiments, forming the memory device may include forming a first electrode layer, forming a memory layer on the first electrode layer, and forming a second electrode layer on the memory layer. Various embodiments may relate to forming a vertically stacked arrangement include a first electrode, a memory layer over the first electrode, and a second electrode over the memory layer.

In various embodiments, forming the tactile sensor may include forming a pressure sensing layer on the second electrode layer. In various embodiments, the second electrode layer may be also an electrode layer of the tactile sensor. In other words, the tactile sensor and the memory device may have a common electrode. Various embodiments may relate to forming a vertically stacked arrangement including a first electrode, a memory layer over the first electrode, a second electrode over the memory layer, and a pressure sensing layer over the second electrode.

The memory device may be formed over a substrate. The substrate may be a rigid substrate such as a semiconductor substrate, or a flexible substrate such as a polyimide substrate. The semiconductor substrate may for instance include silicon, silicon oxide, or a combination of both.

FIG. 4 is a schematic 400 showing a method of operating a pressure sensing electronic device according to various embodiments. The method may include, in 402, applying an external pressure to a tactile sensor comprised in the pressure sensing device, the tactile sensor configured to determine the external pressure. The method may also include, in 404, applying a writing current to the electronic device including the tactile sensor and a memory device electrically coupled to the tactile sensor so that the memory device switches from a first state to a second state upon the external pressure determined by the tactile sensor exceeding a predetermined threshold.

In other words, a method of sensing an external pressure and storing information pertaining to the external pressure may be provided. The method may include using a tactile sensor to determine an applied external pressure, which may be applied on the tactile sensor. When the applied external pressure is more than a predetermined threshold, a writing current passing through an electronic device including the tactile sensor and the memory device may cause the memory device to switch from a first state to a second state, thus "writing" information pertaining to the external pressure to the memory device can be stored.

The tactile sensor may be a resistive tactile sensor having a resistance based on the external pressure. The resistive tactile sensor may be configured so that the resistance of the resistive tactile sensor decreases upon application of the external pressure on the resistive tactile sensor, thereby causing an increase in the writing current through the resistive tactile sensor and the memory device.

The memory device may be configured to switch from the first state to the second state upon the writing current flowing through the resistive tactile sensor and the memory device exceeding a predetermined value when the external pressure determined by the tactile sensor exceeds the predetermined threshold.

The memory device may have a higher resistance in the first state than in the second state. The first state may be referred to as a "high resistance state," and the second state may be referred to as a "low resistance state."

The method may further include applying an erasing current in a direction opposite to the direction of the writing current to switch from the second state to the first state. The erasing current may be applied when the external pressure is applied to the tactile sensor.

The memory device may be configured to be or remain in the second state when the external pressure is removed after applying the external pressure.

In various embodiments, the memory device may be a resistive switching memory device.

In various embodiments, the method may further include applying a reading current. The reading current may determine whether the memory device is in the first resistance state or the second resistance state. The reading current may be lower than the writing current.

Resistive switching memory device may be an excellent candidate for the integration with pressure sensors to achieve haptic memory, and may be utilized to emulate the memory functionality of the brain by constructing artificial neuromorphic networks as it behaves similarly to synapses among neurons in storing analogue value.

Furthermore, compared with other memory devices, resistive switching memory device may be more promising for building future nonvolatile memories due to its supreme memory performance, high scalability, low operating energy, great endurance, and long retention time. The operation of a resistive switching memory device may rely on the change of resistance in a resistance switching cell, which typically has a two-terminal geometry with a metal-insulator-metal (MIM) architecture. Information may be stored and operated in the memory device because a cell may be electrically configured to switch between a high resistance state (HRS) and a low resistance state (LRS), corresponding to an OFF (0) and an ON (1) state, respectively. In a similar way, a resistive pressure sensor may reflect the loading or unloading of an external force by the changes in resistance. Typically, the resistance of a resistive pressure sensor may decrease when a pressure is applied, and vice versa. Thus, the similarity in the resistive switching memory and resistive pressure sensing devices may facilitate or allow the integration of these two kinds of electronic units to realize the nonvolatile memory of applied pressure, by programming memory cells with the resistance change in pressure sensors.

Various embodiments may relate to haptic memory devices for the mimicry of human haptic memory through the integration of resistive switching memory devices with resistive pressure sensors, where the resistance states in a memory cell may be electrically reconfigured by applied pressure on a pressure sensor. Moreover, the applied pressure distribution may be recorded by introducing memory cell arrays including a plurality of haptic memory devices. Each haptic memory device may be referred as a memory cell. Each integrated haptic memory device may include a pressure sensor and memory device in series.

Figure 5A:
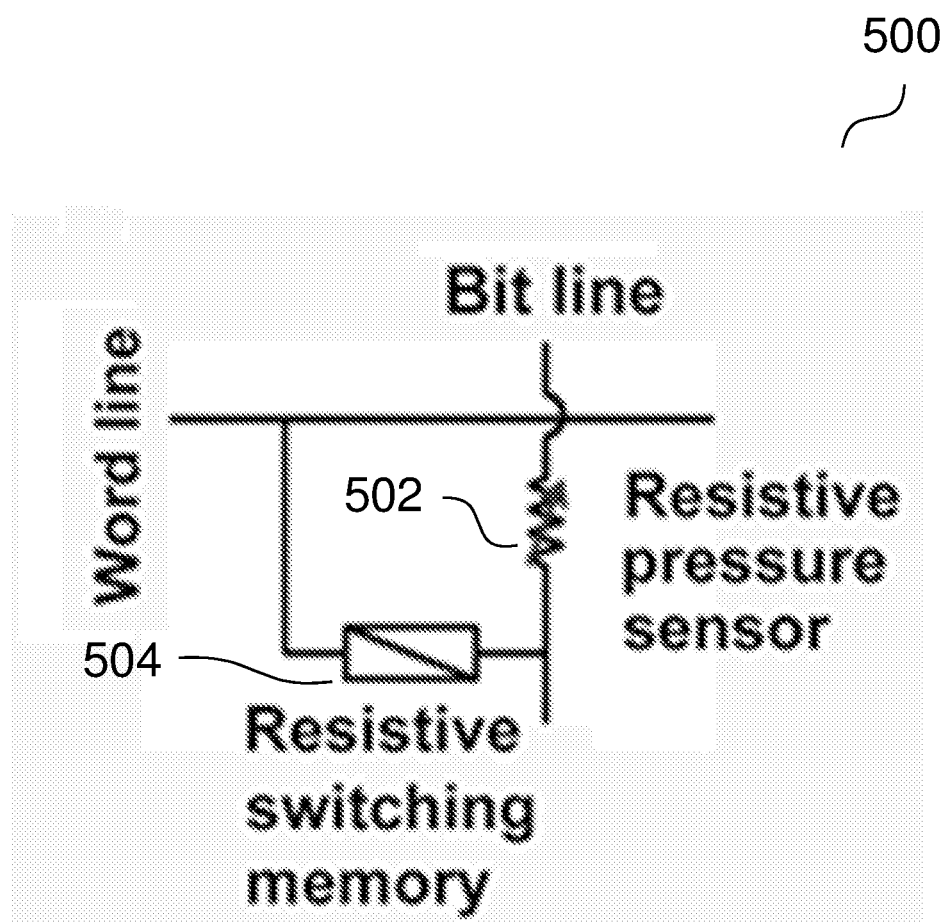
FIG. 5A is a circuit representation of a haptic memory device according to various embodiments.

FIG. 5A is a circuit representation of a haptic memory device 500 according to various embodiments. FIG. 5A shows the pressure sensor 502 and the memory device 504 connected in series. The integration of memory device 504 and pressure sensor 502 may be realized by replacing the bottom electrode of a pressure sensor 502 with the electrode of a resistive switching memory device 504. During writing, a potential difference may be applied across the pressure sensor 502 and the memory device 504 so that a writing current flows through the pressure sensor 502 and the memory device 504.

Figure 5B:
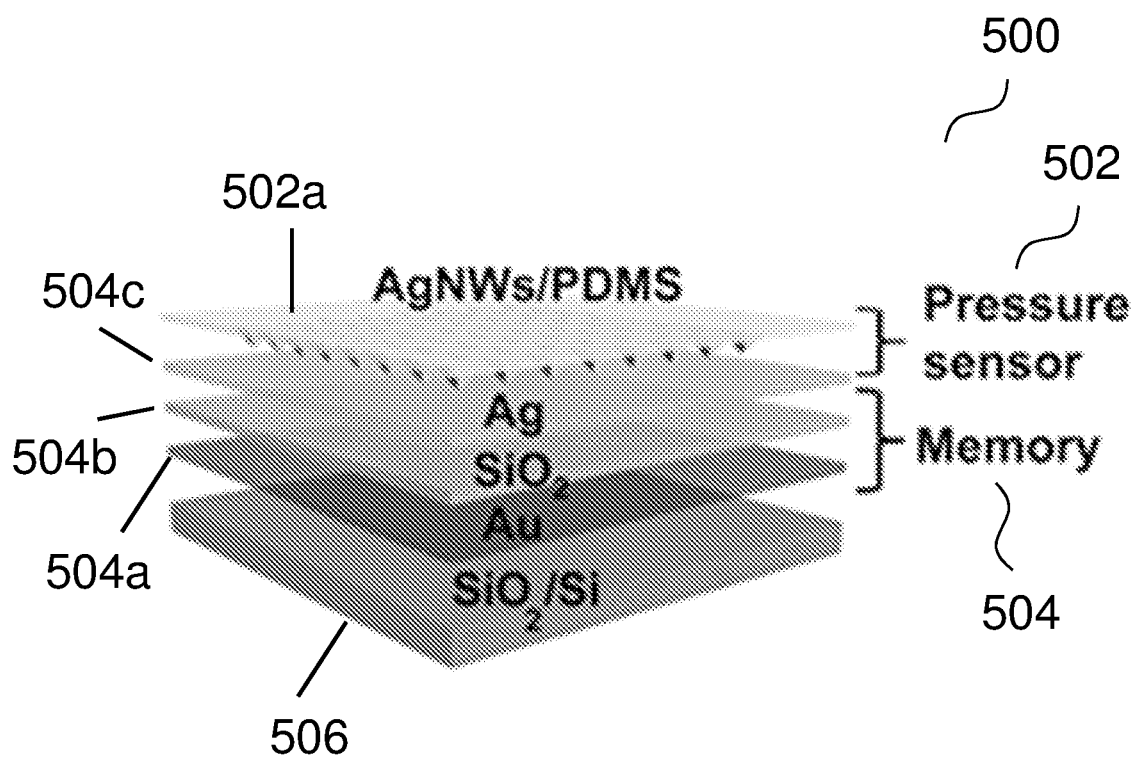
FIG. 5B shows a schematic showing the haptic memory device according to various embodiments.

FIG. 5B shows a schematic showing the haptic memory device 500 according to various embodiments. FIG. 5B shows the pressure sensor 502 over the memory device 504. The haptic memory device 500 may include a substrate 506, a first electrode 504a over the substrate 506, a memory layer 504b on the first electrode 504a, a second electrode 504c on the memory layer 504b, and a pressure sensing layer 502a on the second electrode 504. The second electrode 504c may be an electrode that is common to or shared by the memory device 504 and the pressure sensor 502. In this way, the resistance changes in the pressure sensor 502 induced by external pressures may result in the voltage changes on the electrode 504c of the resistive switching memory device 504, leading to a switch in resistance state of the memory device 504, and the pressure information may be retained by the memory device 504. The substrate 506 may include a suitable semiconductor material such as silicon, silicon oxide ($SiO_2$), or a combination thereof. For instance, the substrate 506 may include silicon oxide layer over a silicon wafer. Alternatively, the substrate 506 may be a soft or flexible substrate, i.e., the substrate may include a material such as polyimide.

The pressure sensing layer 502a (or sensitive layer) of the resistive pressure sensor 502 may include a micro-structured polydimethylsiloxane (PDMS) film with silver nanowires (AgNWs) embedded in the PDMS film. The pressure sensing layer 502a may also serve as a top electrode layer of the pressure sensor 502, while electrode 504c may serve as a bottom electrode layer of the pressure sensor 502. The introduction of microstructure arrays may provide the pressure sensor 502 with high sensitivity in low pressure regime (<1 kPa). The resistive switching memory device 504 may take advantage of the MIM architecture, with silicon oxide ($SiO_2$) serving as the memory layer 504b (which may also be referred to as the switching layer), providing fast switching time, high endurance as well as nonvolatile memory by virtue of good resistance switching behaviors of $SiO_2$.

In order to render haptic memory devices 500 highly sensitivity for tactile sensing, the silver nanowires/polydimethylsiloxane (AgNWs/PDMS) film with pyramidal microstructure arrays may be utilized to serve as the pressure sensitive layer 502a. The pyramidal microstructure arrays may face the second electrode 504c. The micro-structured AgNWs/PDMS films may be fabricated by curing PDMS precursor on a micro-structured silicon master cased with AgNWs.

Figure 5C:
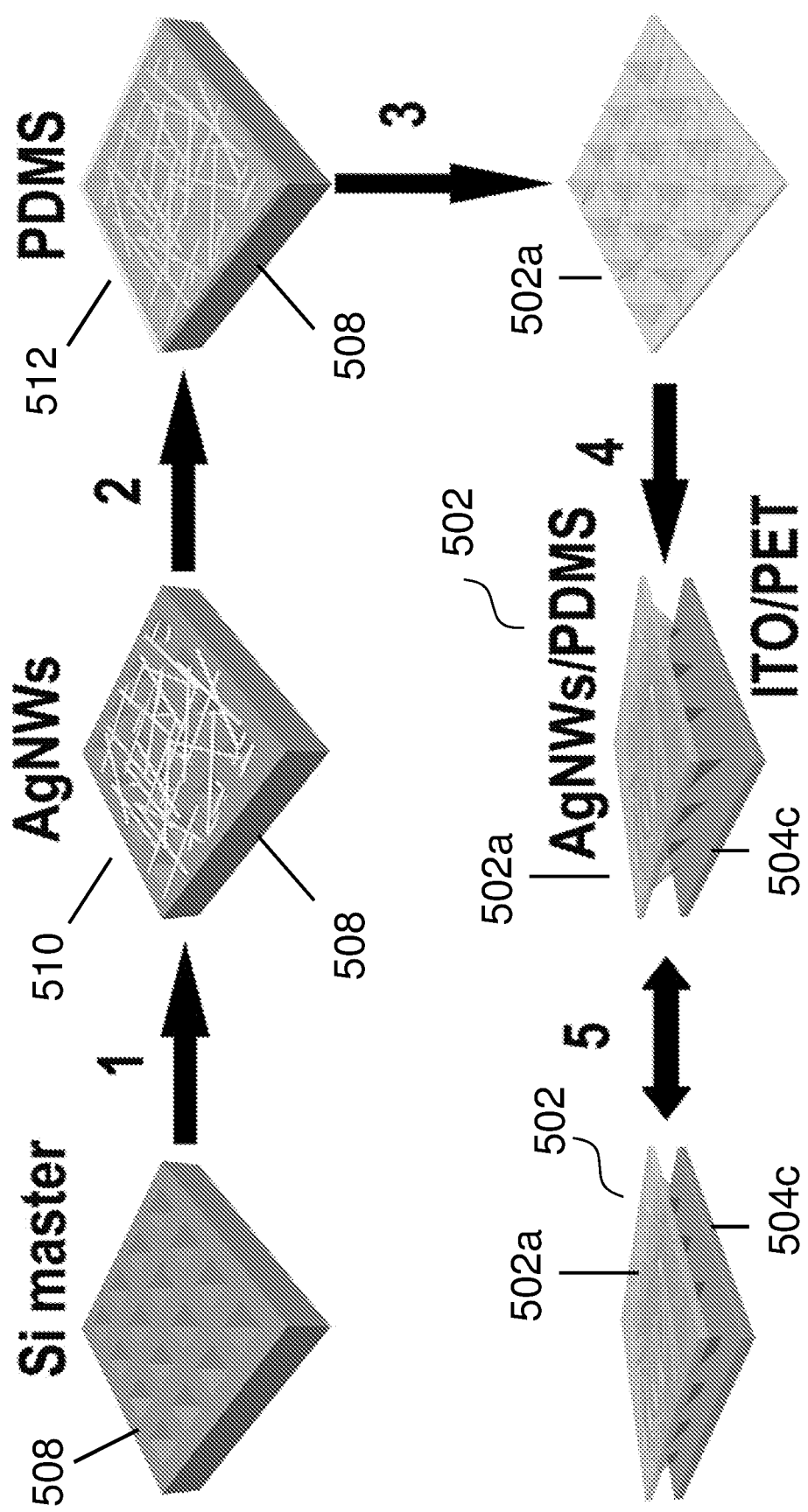
FIG. 5C is a schematic showing a method of forming a resistive pressure sensor according to various embodiments.

FIG. 5C is a schematic showing a method of forming a resistive pressure sensor according to various embodiments. The AgNWs solution 510 may be deposited (e.g., drop by drop) and dried on a silicon master 508, which may contain recessed pyramidal microstructure arrays. A mixture of PDMS elastomer precursor and cross-linker 512 may then be spin-coated on the silicon master 508. After a degassing step, the elastomer precursor and cross-linker 512 may be cured at about 90° C. for about 1 hour. The cured elastomer may be peeled off from the silicon master 508 to form a free-standing pressure sensing layer 502a, i.e., a microstructured AgNWs/PDMS film. The microstructured AgNWs/PDMS film 502a may be placed face-to-face with the second electrode layer 504c such as an indium tin oxide (ITO)/polyethylene terephthalate (PET) film or a silver (Ag) layer to form the resistive pressure sensor 502.

The application and release of an external pressure may induce a resistance change in the resistive pressure sensor 502.

Figure 5D:
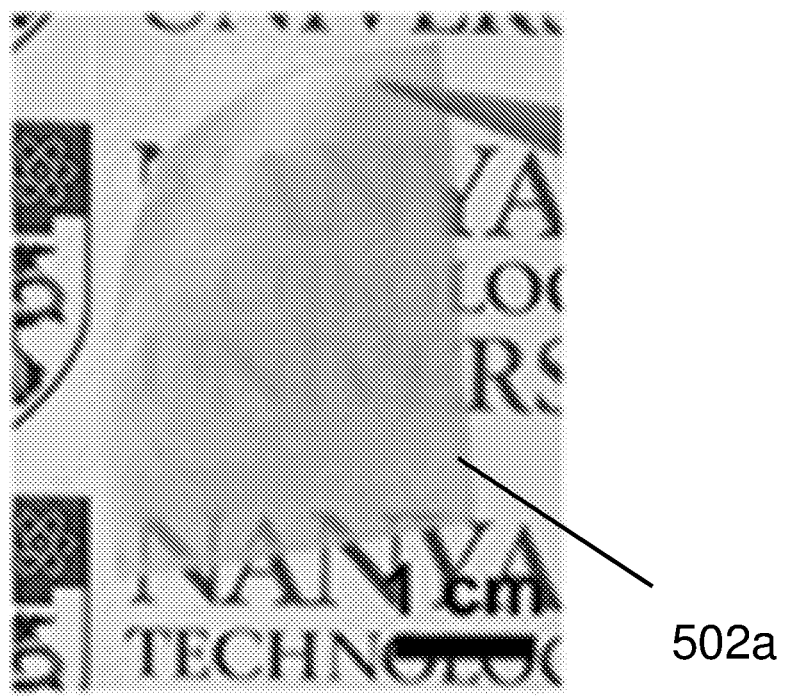
FIG. 5D shows a digital photo of as-prepared silver nanowires/polydimethylsiloxane (AgNWs/PDMS film) with microstructures according to various embodiments.
Figure 5E:
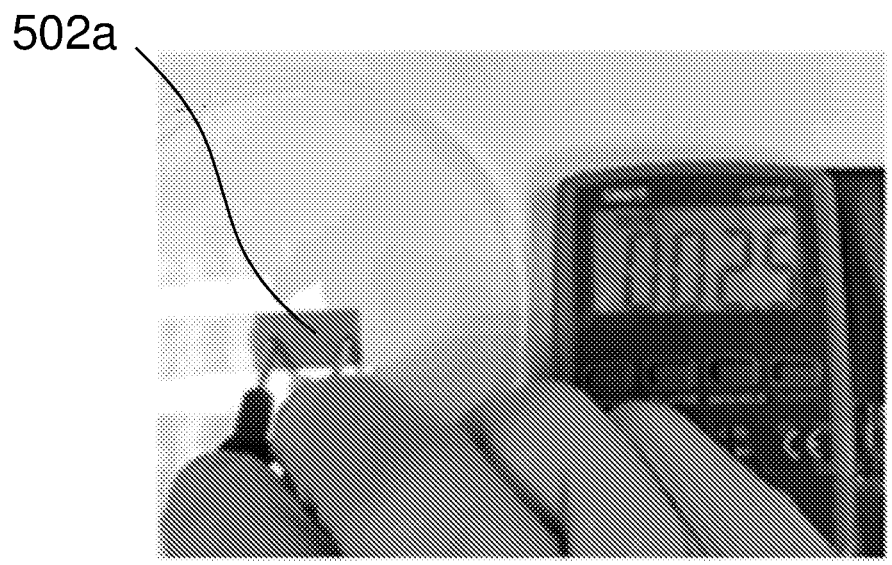
FIG. 5E shows a photo showing an electrical test being carried out on the as-prepared AgNWs/PDMS film with microstructures according to various embodiments showing good electrical conductivity.

The AgNWs may be embedded in the microstructured PDMS, and the convex pyramidal microstructures on AgNWs/PDMS film may replicate or correspond to the patterns on the silicon master 508. The as-prepared AgNWs/PDMS may be semi-transparent and flexible, with large-area fabrication capability together with good electrical conductivity. FIG. 5D shows a digital photo of as-prepared AgNWs/PDMS film with microstructures 502a according to various embodiments. FIG. 5E shows a photo showing an electrical test being carried out on the as-prepared AgNWs/PDMS film with microstructures 502a according to various embodiments showing good electrical conductivity.

Figure 5F:
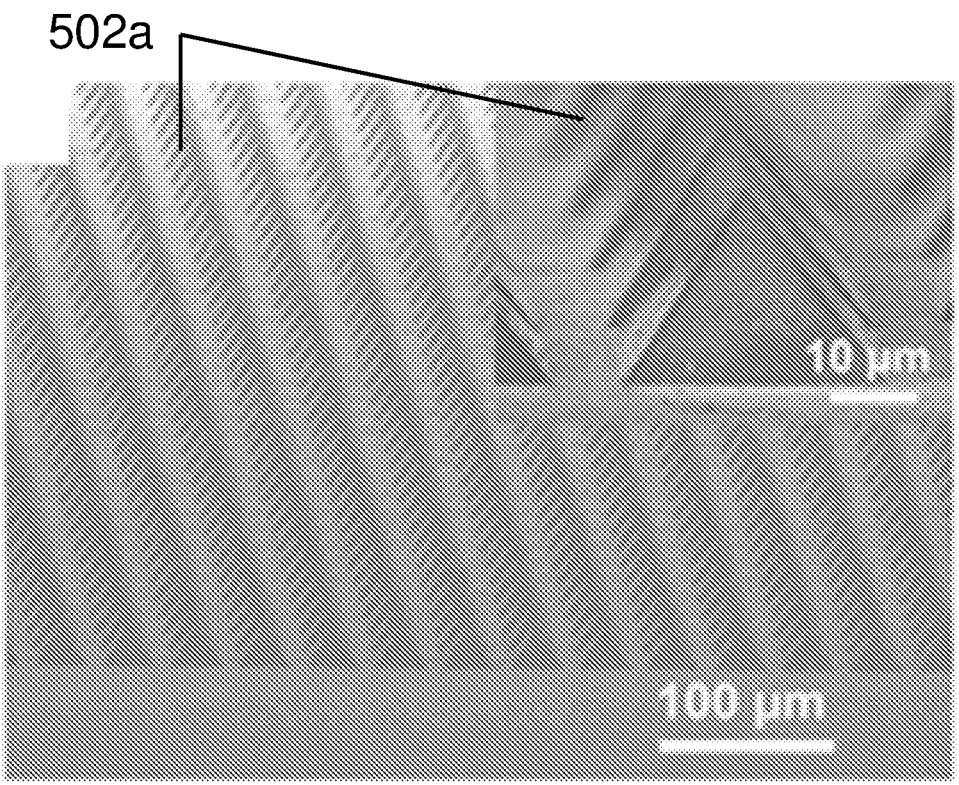
FIG. 5F shows tilted scanning electron microscopy (SEM) images of the micro-structured AgNWs/PDMS film according to various embodiments.
Figure 5G:
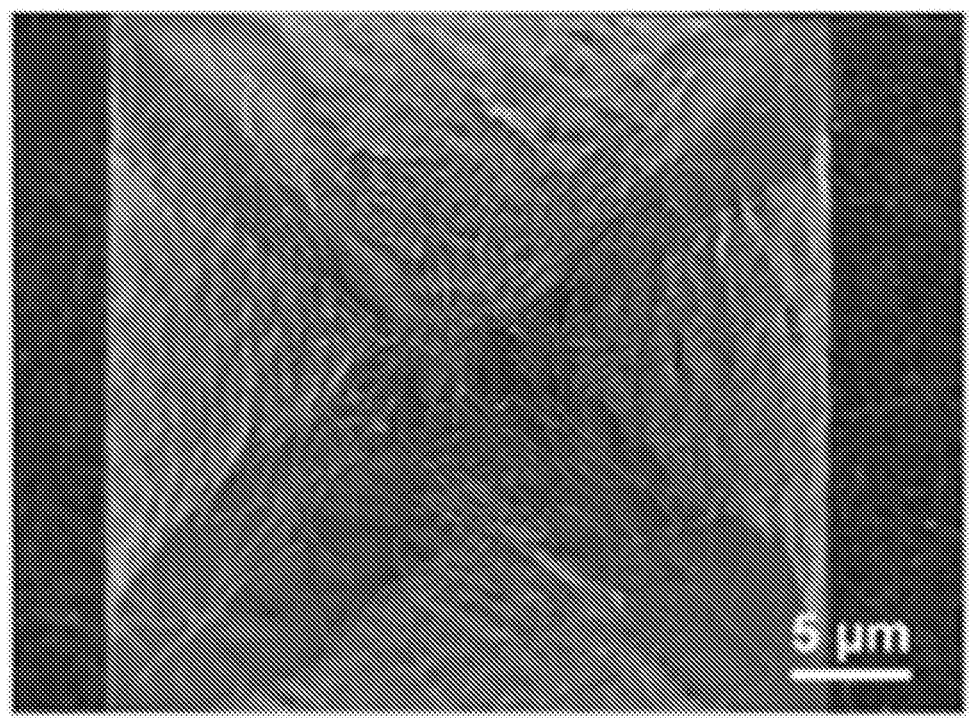
FIG. 5G shows a scanning electron microscopy (SEM) image of an individual pyramid structure according to various embodiments.

FIG. 5F shows tilted scanning electron microscopy (SEM) images of the microstructured AgNWs/PDMS film 502a according to various embodiments. FIG. 5F reveals that the film may retain the regular pyramidal patterns after the placement of the AgNWs. The length of the pyramid microstructure in a pressure sensor unit is 30 μm, controlled through photolithography process. From the enlarged tilted SEM image (inset of FIG. 5F), sharp tips of the pyramids may be clearly viewed. The AgNWs were within the same pyramidal microstructures. In other words, the pyramidal microstructures may include nanostructures such as AgNWs embedded in a matrix material such as PDMS. The AgNWs may confer the pyramidal microstructures electrical conductivity. FIG. 5G shows a scanning electron microscopy (SEM) image of an individual pyramid structure according to various embodiments. The morphology of AgNWs may be clearly observed in FIG. 5G. It is noteworthy that the SEM images shown in FIGS. 5F and 5G were collected without sputtering a thin metal film, illustrating good conductivity of the microstructured film.

Figure 5H:
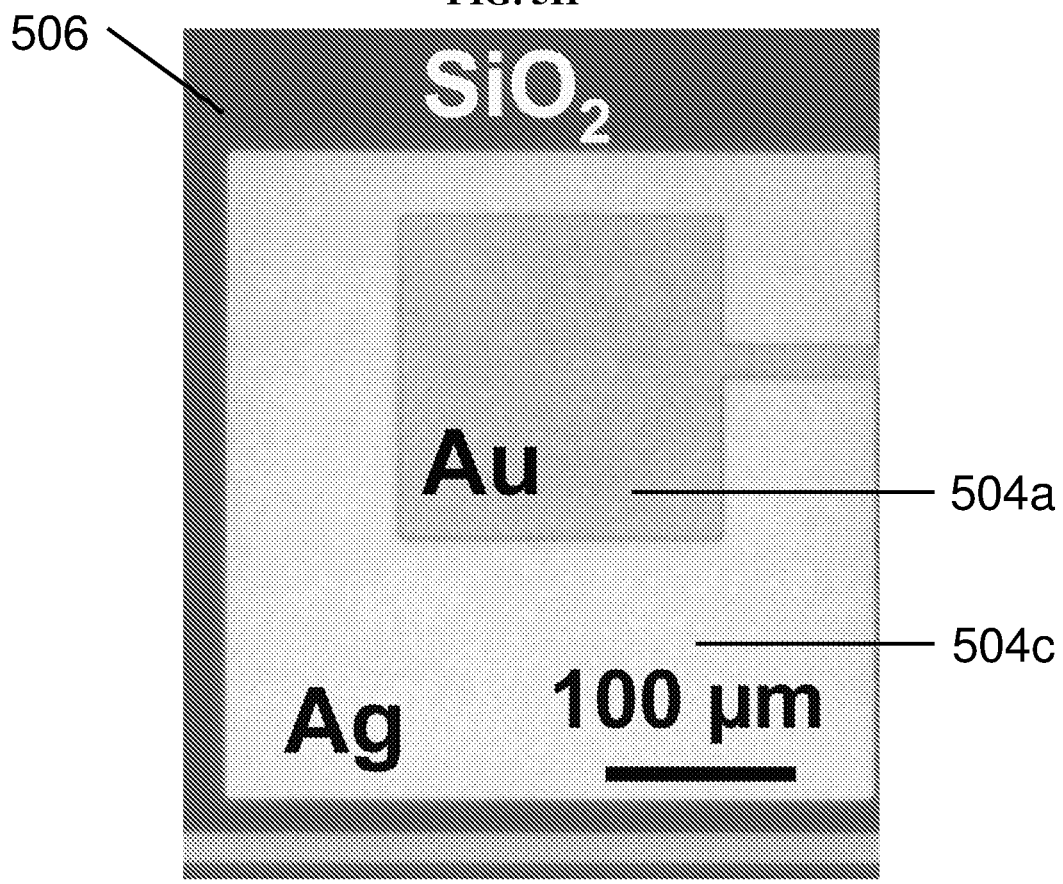
FIG. 5H is a photo showing an optical image of an individual memory cell with a gold (Au) bottom electrode aligned beneath the silver (Ag) top electrode to form the resistive switching memory cell according to various embodiments.
Figure 5I:
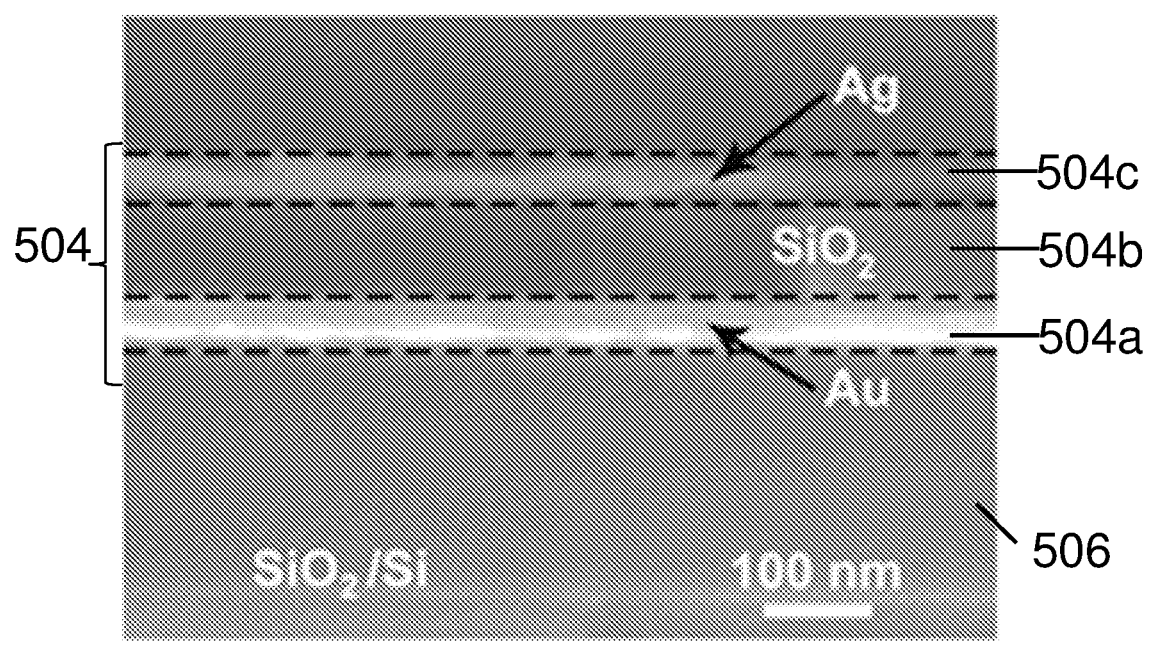
FIG. 5I is a cross-sectional scanning electron microscopy image of a memory cell according to various embodiments.

A metal-insulator-metal (MIM) architecture of $Ag/SiO_2/Au$ may be used in the resistive switching memory cell 504. In a typical experiment, a 5 nm chromium (Cr) adhesion layer may be deposited and patterned on $SiO_2$/Si substrate 506, and a 50 nm gold (Au) film may be deposited and patterned on the Cr adhesion layer through thermal evaporation and photolithography methods to serve as the bottom electrodes 504a. Silicon oxide $SiO_2$ deposited onto Au electrode patterns 504a by RF sputtering to form the memory layer 504b about 100 nm thick. Finally, the Ag electrodes 504c, with a thickness of about 50 nm and an area of about 400×400 μm$^2$, may be aligned and patterned on the top of $SiO_2$ film 504b via a second photolithography process. FIG. 5H is a photo showing an optical image of an individual memory cell with a gold (Au) bottom electrode 504a aligned beneath the silver (Ag) top electrode 504c to form the resistive switching memory cell 504 according to various embodiments. The bottom electrode 504a may be over the substrate 506. FIG. 5I is a cross-sectional scanning electron microscopy image of a memory cell 510 according to various embodiments. As shown in FIG. 5I, the memory cell may be a layered structure including a $SiO_2$/Si substrate 506, an Au bottom electrode 504a over the substrate 506, a $SiO_2$ memory layer 504b on the bottom electrode 504a, and a Ag top electrode 504c on the memory layer 504b. The memory device 504 may be then integrated with pressure sensor 502 by placing the microstructured AgNWs/PDMS film 502a face-to-face to the Ag electrodes 504c of the memory cell array 504, with the Ag electrodes 504c serving as the bottom electrode of the resistive pressure sensor 502 and the top electrode of resistive switching memory device 504.

The introduction of pyramidal microstructure patterns may provide superior sensitivity to pressure sensors regardless of sensing techniques due to their anisotropic configuration. The microstructured AgNWs/PDMS film 502a may serve as the sensitive layer in the resistive pressure sensor 502. By providing the AgNWs/PDMS film over a flat indium tin oxide (ITO)-coated flexible poly(ethyleneterephthalate) (PET) film or silver layer with the pyramidal microstructure patterns facing the electrode 504c, numerous connections between pyramid tips and the electrode 504c may be formed.

Figure 6A:
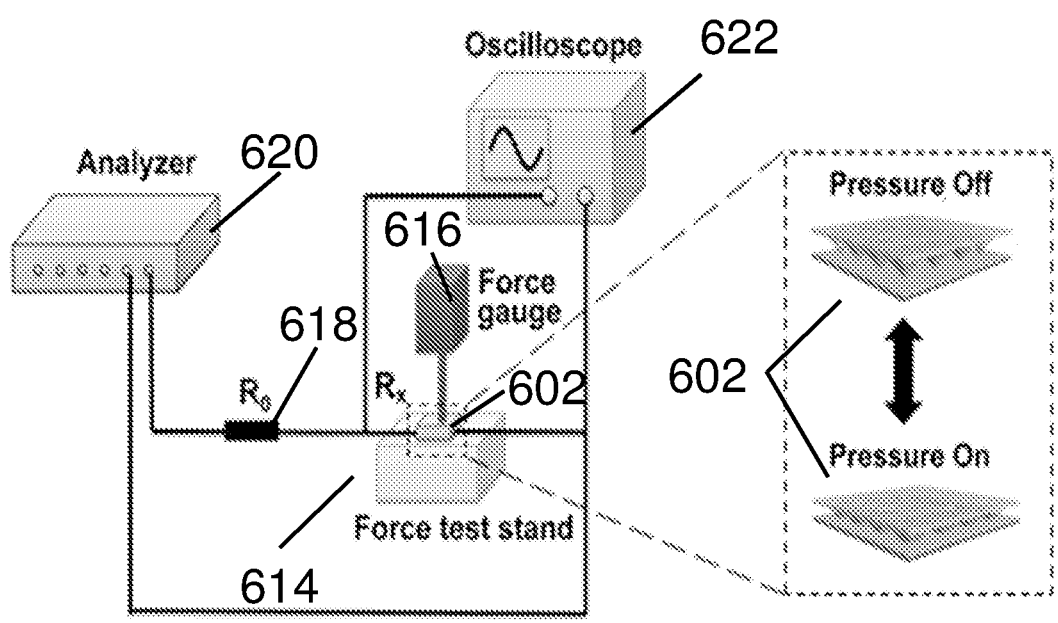
FIG. 6A is a schematic showing an experimental measurement setup for testing the pressure sensor according to various embodiments.

FIG. 6A is a schematic showing an experimental measurement setup for testing the pressure sensor 602 according to various embodiments. A computer (not shown in FIG. 6A) may control a z-axis motorized force test stand 614 to apply a force on the pressure sensor 602. The force may be read by a force gauge 616 and recorded by computer. A constant resistor ($R_0$) 618 may be connected with the resistive pressure sensor ($R_x$) 602 in series. A semiconductor parameter analyzer 620 may provide a voltage bias (about 1 V) to the constant resistor 618 and the pressure sensor 602. The pressure response time of the sensor 602 may be recorded by an oscilloscope 622, with the voltage drop across the pressure sensor 602 reflecting the application of external force. The right side of FIG. 6A illustrates the sensing mechanism of the resistive pressure sensor 602. The applied force may induce the deformation of pyramidal microstructures, leading to a resistance change in the contact resistance between the pyramids and the substrate. The AgNWs/PDMS film may serve as both the top electrode and pressure sensitive layer, and the ITO film may act as the bottom electrode.

Figure 6B:
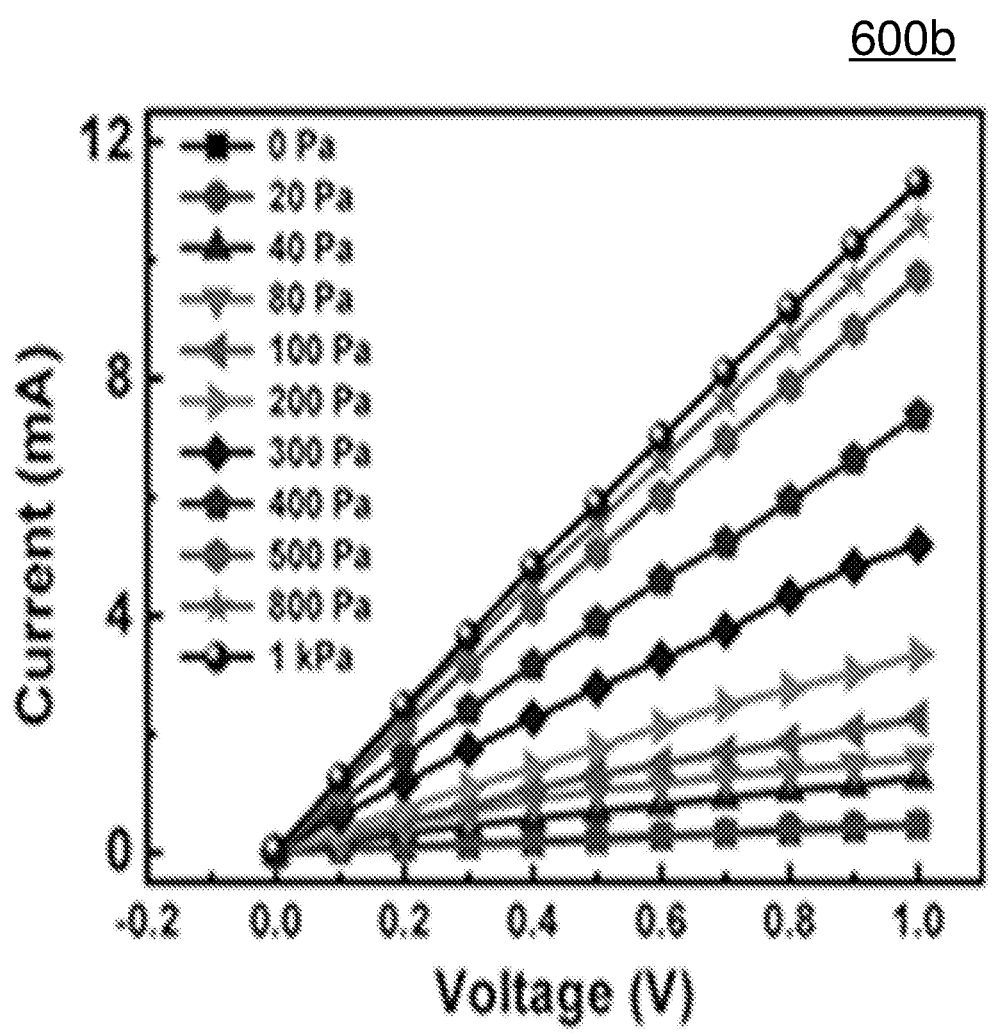
FIG. 6B is a plot of current (milliamperes or mA) as a function of voltage (volts or V) showing current-voltage curves of a microstructured silver nanowires/polydimethylsiloxane (AgNWs/PDMS) based pressure sensor according to various embodiments responding to different applied pressures.

FIG. 6B is a plot 600b of current (milliamperes or mA) as a function of voltage (volts or V) showing current-voltage curves of a microstructured silver nanowires/polydimethylsiloxane (AgNWs/PDMS) based pressure sensor according to various embodiments responding to different applied pressures. FIG. 6B shows that for a low pressure regime of about 0 to about 1 kPa, the resistance of the pressure sensor may drop significantly with the application of pressure. The sensitivity of the sensor, S, may be defined as S=dR/dP, where R is the resistance and P is applied pressure. The sensor may exhibit low hysteresis in both gradually increasing and decreasing cycles of applied pressure, which may be possible by virtue of the excellent uniformity of the microstructured arrays.

Figure 6C:
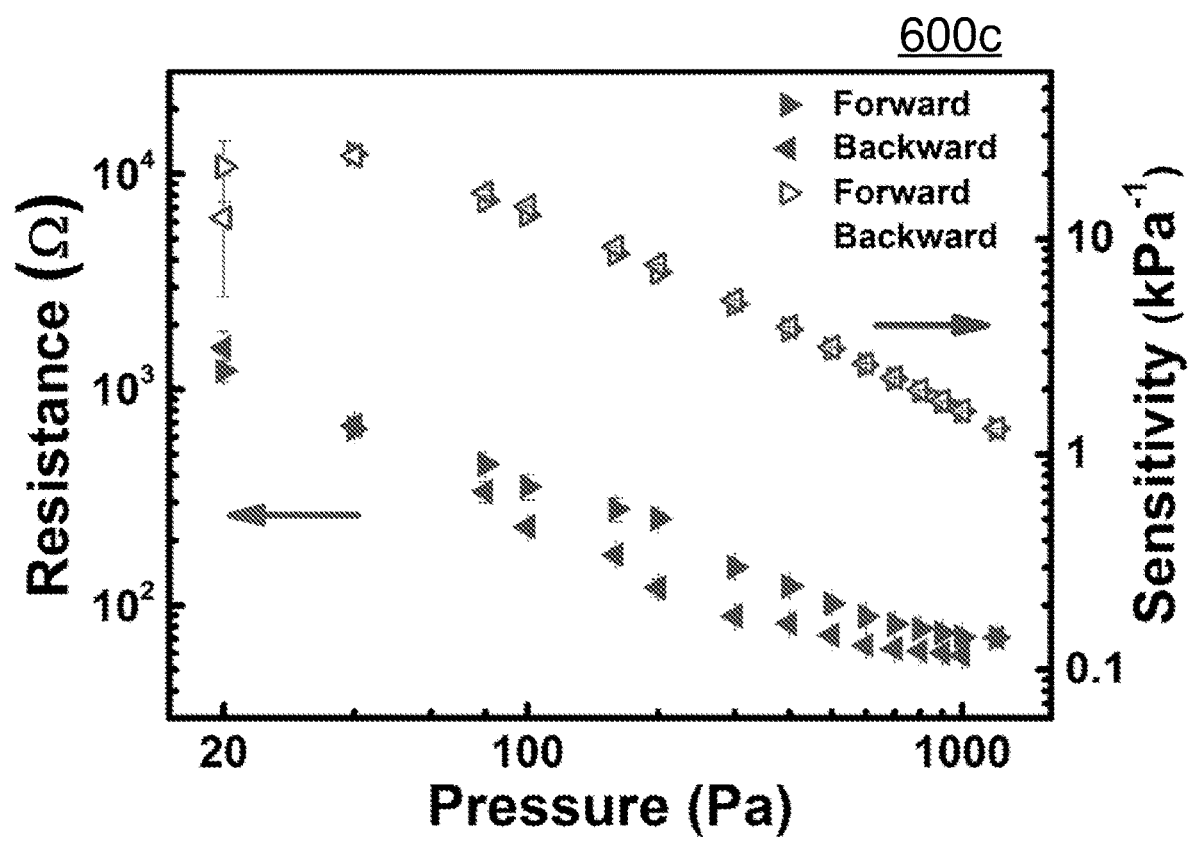
FIG. 6C is a plot of resistance (ohms or Ω)/sensitivity (per kilo-pascal or $kPa^{-1}$) as a function of pressure (pascals or Pa) showing changes in resistance/sensitivity of the pressure sensor with pressure according to various embodiments.

FIG. 6C is a plot 600c of resistance (ohms or Ω)/sensitivity (per kilo-pascal or $kPa^{-1}$) as a function of pressure (pascals or Pa) showing changes in resistance/sensitivity of the pressure sensor with pressure according to various embodiments. The pressure sensor was applied with a range of pressure from about 200 Pa to about 800 Pa to demonstrate the reliability of the pressure sensor in detecting tiny pressure values. The error bars may represent standard deviations from 5 test cycles. FIG. 6C shows that the pressure sensor may have high sensitivity of about 1.3 $kPa^{-1}$ to about 24.8 $kPa^{-1}$ in the range of <1 kPa.

Figure 6D:
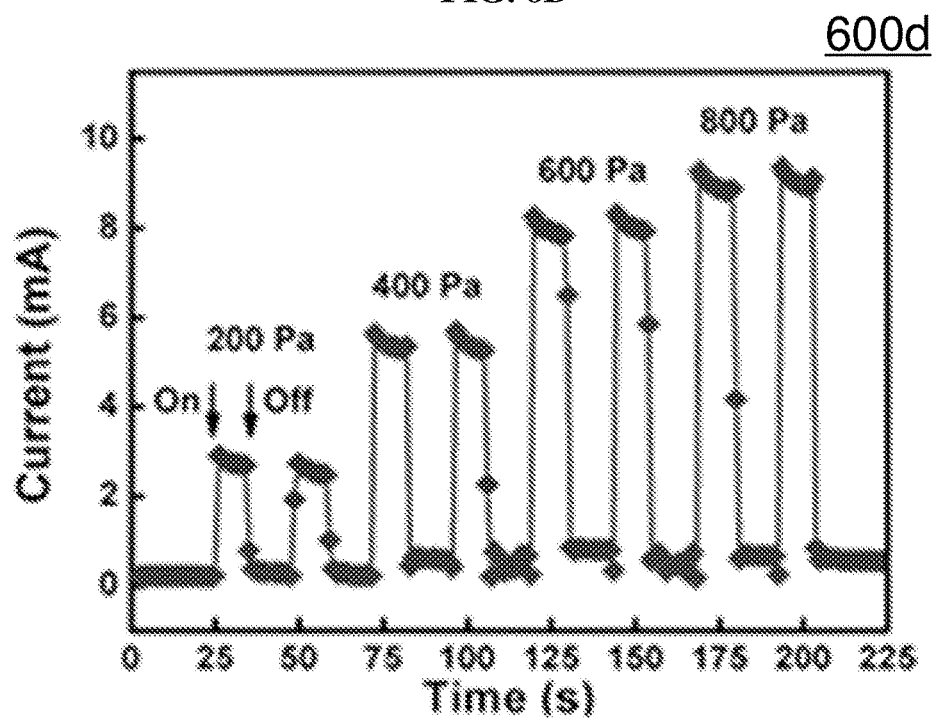
FIG. 6D is a plot of current (milliamperes or mA) as a function of time (seconds or s) showing the instantaneous current change of the pressure sensor with different applied pressure values according to various embodiments.

FIG. 6D is a plot 600d of current (milliamperes or mA) as a function of time (seconds or s) showing the instantaneous current change of the pressure sensor with different applied pressure values according to various embodiments. FIG. 6D shows that the real-time current changes of the sensor may be retained at about the same level upon the applications of identical or similar pressure values. The current may change in response to different levels of applied pressures. The pressure sensor may exhibit the capability of sensing and discerning pressure in low regimes.

Figure 6E:
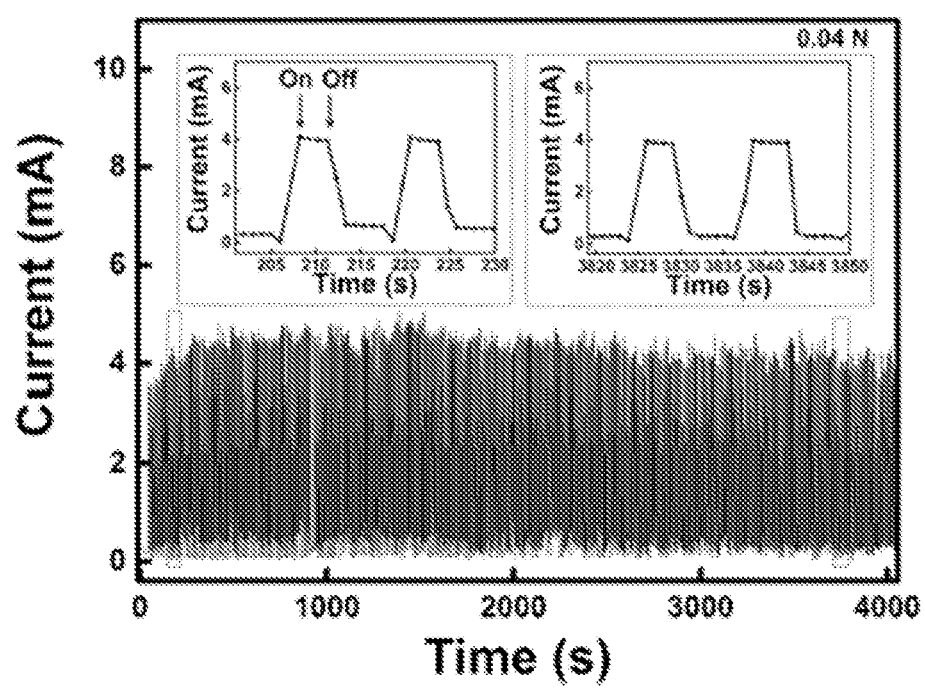
FIG. 6E is a plot of current (milliamperes or mA) as a function of time (seconds or s) showing the current-time curve of a microstructured silver nanowires/polydimethylsiloxane (AgNWs/PDMS) based pressure sensor in response to loading and unloading of 0.04 newtons (N) for 400 cycles (10 seconds for each cycle) according to various embodiments, with insets showing the magnified views of current changes when pressure is applied and removed during two loading/unloading operations at the beginning and ending cycles.

FIG. 6E is a plot 600e of current (milliamperes or mA) as a function of time (seconds or s) showing the current-time curve of a microstructured silver nanowires/polydimethylsiloxane (AgNWs/PDMS) based pressure sensor in response to loading and unloading of 0.04 newtons (N) for 400 cycles (10 seconds for each cycle) according to various embodiments, with insets showing the magnified views of current changes when pressure is applied and removed during two loading/unloading operations at the beginning and ending cycles. The current returns to about the same level after every cycle of loading and uploading, demonstrating the stable response of the sensor to the same load. The sensing area is about 1 $cm^2$.

Figure 6F:
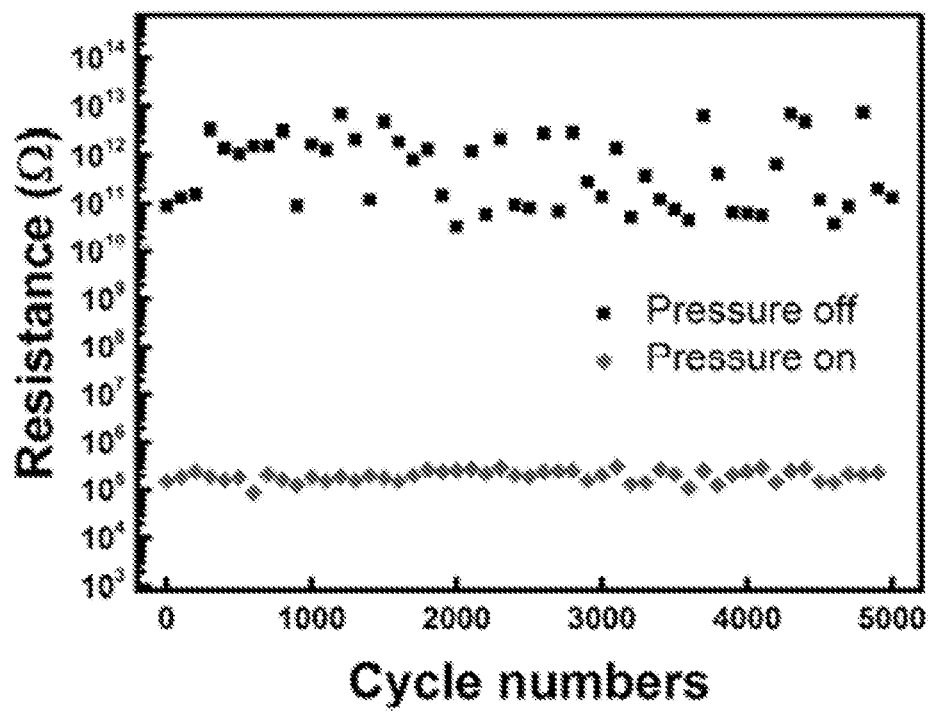
FIG. 6F is a plot of resistance (ohms or Ω) as a function of cycle number showing the stability of a microstructured silver nanowires/polydimethylsiloxane (AgNWs/PDMS) based pressure sensor to repeatedly loading/unloading pressure of about 1 kPa for 5000 cycles according to various embodiments.

FIG. 6F is a plot 600f of resistance (ohms or Ω) as a function of cycle number showing the stability of a microstructured (silver nanowires/polydimethylsiloxane) AgNWs/PDMS based pressure sensor to repeatedly loading/unloading pressure of about 1 kPa for 5000 cycles according to various embodiments. The diamonds correspond to the application of pressure, while the squares correspond to the release of pressure. Although the pressures sensor exhibits a baseline fluctuation in the absence of applied pressure, the pressure sensor with the pressure loads shows less variation in the resistance readings, indicating a good sensing stability of the microstructured AgNWs/PDMS films.

Figure 6G:
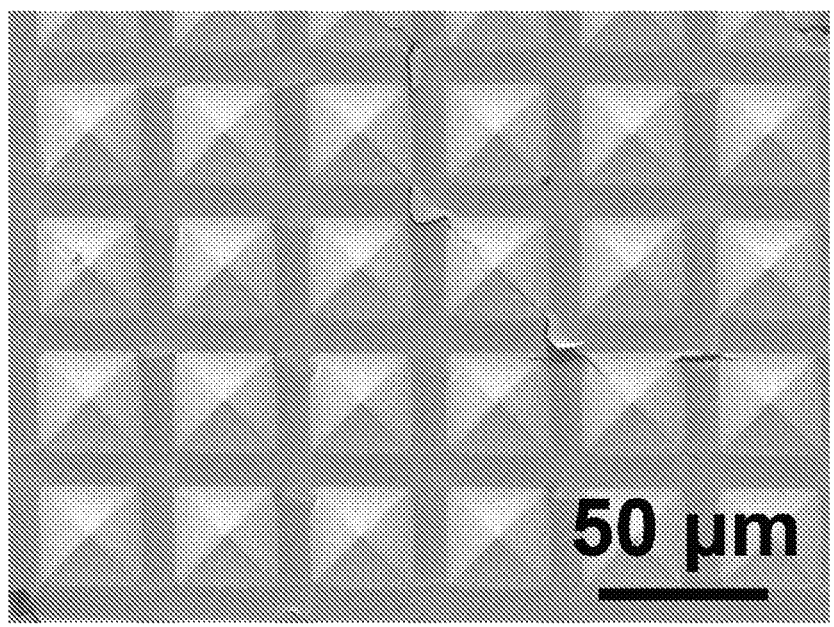
FIG. 6G is a scanning electron microscopy (SEM) image of an as-deposited micro-structured gold/polydimethylsiloxane (Au/PDMS) film through thermal evaporation with a thickness of about 100 nm according to various embodiments.
Figure 6H:
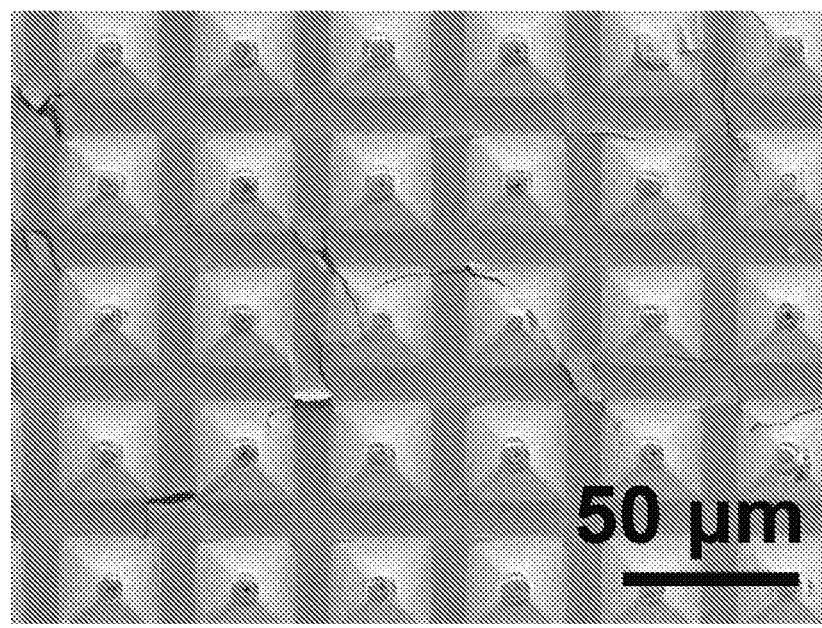
FIG. 6H is a scanning electron microscopy (SEM) image of the micro-structured gold/polydimethylsiloxane (Au/PDMS) film after loading and unloading with a pressure of 1 kilo-pascals (kPa) for 500 cycles according to various embodiments.

The AgNWs/PDMS films may outperform metal-coated PDMS films in terms of mechanical stability and retention of pyramidal geometry. FIG. 6G is a scanning electron microscopy (SEM) image 600g of an as-deposited micro-structured gold/polydimethylsiloxane (Au/PDMS) film through thermal evaporation with a thickness of about 100 nm according to various embodiments. FIG. 6H is a scanning electron microscopy (SEM) image 600h of the micro-structured gold/polydimethylsiloxane (Au/PDMS) film after loading and unloading with a pressure of 1 kilo-pascal (kPa) for 500 cycles according to various embodiments. The micro-structured gold/polydimethylsiloxane (Au/PDMS) films shown in FIGS. 6G and 6H include PDMS coated with gold. Cracks may be observed on the gold coated films, showing that the microstructures in FIGS. 6G and 6H may not be able to perfectly maintain pyramidal geometry after serving as a sensitive layer in a pressure sensor.

Figure 6I:
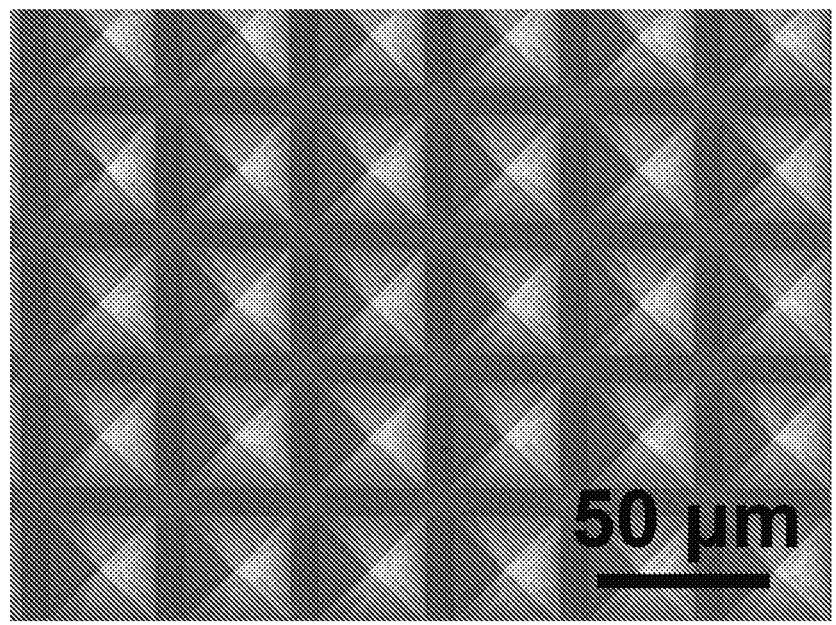
FIG. 6I is a scanning electron microscopy (SEM) image of an as-prepared micro-structured silver nanowires/polydimethylsiloxane (AgNWs/PDMS) film according to various embodiments.
Figure 6J:
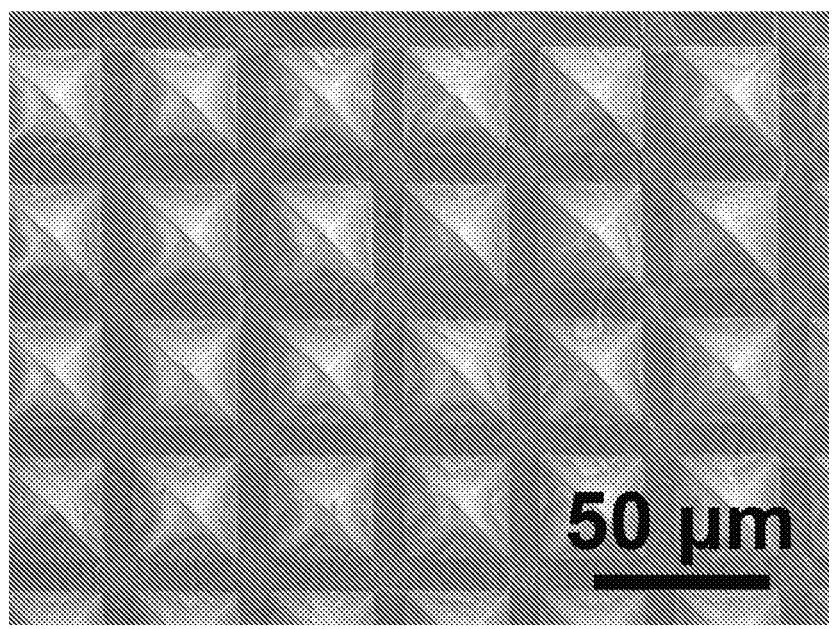
FIG. 6J is a scanning electron microscopy (SEM) image of the micro-structured silver nanowires/polydimethylsiloxane (AgNWs/PDMS) film after loading and unloading with a pressure of 1 kilo-pascal (kPa) for 5000 cycles according to various embodiments.

FIG. 6I is a scanning electron microscopy (SEM) image 600i of an as-prepared micro-structured silver nanowires/polydimethylsiloxane (AgNWs/PDMS) film according to various embodiments. FIG. 6J is a scanning electron microscopy (SEM) image 600j of the micro-structured silver nanowires/polydimethylsiloxane (AgNWs/PDMS) film after loading and unloading with a pressure of 1 kilo-pascal (kPa) for 5000 cycles according to various embodiments. As shown in FIG. 6J, the micro-structured silver nanowires/polydimethylsiloxane (AgNWs/PDMS) film is able to retain the pyramidal shape after 5000 testing cycles. No cracks are observed. The images of the structures in FIGS. 6I and 6J may be obtained without sputtering a metal layer prior to imaging, indicating good conductivity of the AgNWs/PDMS film.

Figure 6K:
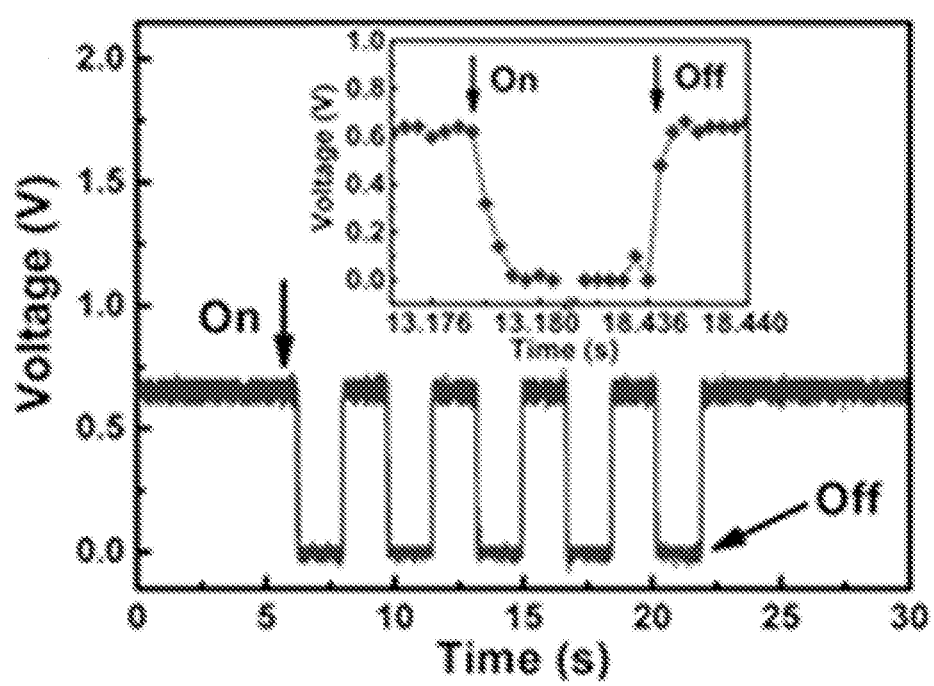
FIG. 6K is a plot of voltage (volts or V) as a function of time (seconds or s) showing the voltage changes across a pressure sensor connected in series with a 500 kilo-ohms (kΩ) resistor when pressure (of around 1 kilo-pascal or 1 kPa) is applied for 5 times according to various embodiments.

Furthermore, the micro-structured pressure sensor may exhibit ultrafast response time. The response time may be reflected in the voltage changes monitored by an oscilloscope. FIG. 6K is a plot 600k of voltage (volts or V) as a function of time (seconds or s) showing the voltage changes across the pressure sensor connected in series with a 500 kilo-ohms (kΩ) resistor when pressure (of around 1 kilo-pascal or 1 kPa) is applied for 5 times according to various embodiments. The inset of FIG. 6K shows the change in voltage during one loading/unloading cycle. A constant bias of about 1 V may be applied to the sensor and the resistor. The pressure of around 1 kPa corresponds to a force of 0.1 N.

Figure 6L:
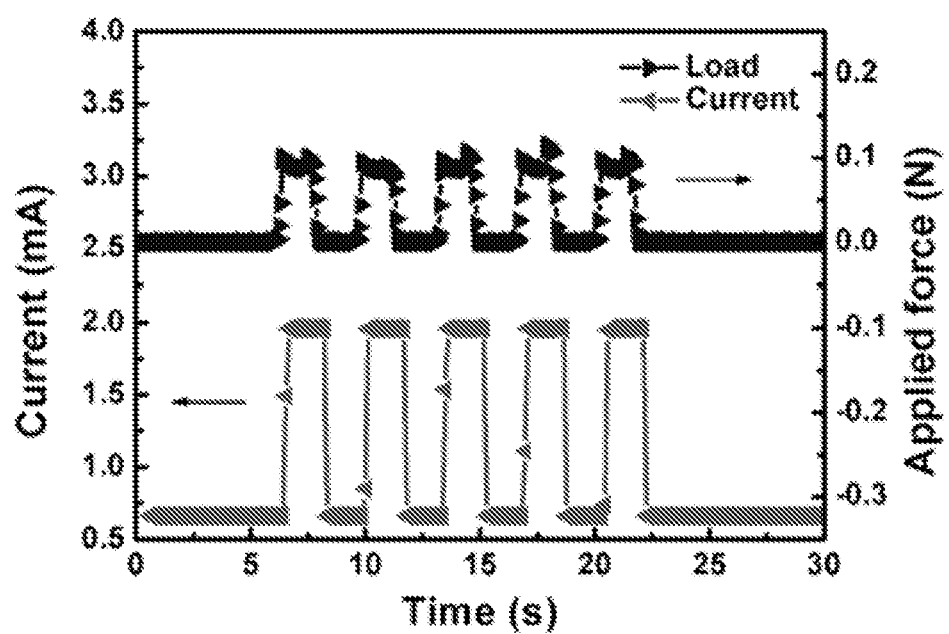
FIG. 6L is a plot of current (milli-amperes or mA)/applied force (newtons or N) as a function of time (seconds or s) showing the current-time curve and the corresponding applied force-time curve of the resistive pressure sensor according to various embodiments.

FIG. 6L is a plot 600l of current (milli-amperes or mA)/applied force (newtons or N) as a function of time (seconds or s) showing the current-time curve and the corresponding applied force-time curve of the resistive pressure sensor according to various embodiments. As seen from FIG. 6L the current change of the resistive sensor may correspond to the applied force. The current change may be recorded by the analyzer, and the applied force may be recorded by the force gauge simultaneously. FIG. 6L corresponds to the voltage changes in FIG. 6K.

In various embodiments, the pressure sensor may respond to the loading/unloading of external forces rapidly and without hysteresis by virtue of the micro-structured array. The sensor may have an ultrafast response time of less than about 4 ms for loading or unloading as shown in the inset of FIG. 6K. Such performance may be comparable to the tactile sensations of the most sensitive parts (e.g., fingertips) of human body.

FIG. 7 shows a comparison table 700 of the performance of one implementation or embodiment of a flexible pressure sensor (labeled as this work) with conventional pressure sensors. The conventional pressure sensors are described in the following literature:

1. R. S. Johansson, J. R. Flanagan, *Nat. Rev. Neurosci.* 2009, 10, 345.
2. C. Lucarotti, C. M. Oddo, N. Vitiello, M. C. Carrozza, *Sensors* 2013, 13, 1435.
3. V. Maheshwari, R. Saraf, Angew. *Chem. Int. Ed.* 2008, 47, 7808.
4. M. L. Hammock, A. Chortos, B. C. K. Tee, J. B. H. Tok, Z. Bao, *Adv. Mater.* 2013, 25, 5997.
5. A. N. Sokolov, B. C. Tee, C. J. Bettinger, J. B.-H. Tok, Z. Bao, *Acc. Chem. Res.* 2011, 45, 361.
6. V. Maheshwari, R. F. Saraf, *Science* 2006, 312, 1501.
7. T. Someya, T. Sekitani, S. Iba, Y. Kato, H. Kawaguchi, T. Sakurai, *Proc. Natl. Acad. Sci.* 2004, 101, 9966.
8. T. Someya, Y. Kato, T. Sekitani, S. Iba, Y. Noguchi, Y. Murase, H. Kawaguchi, T. Sakurai, *Proc. Natl. Acad. Sci.* 2005, 102, 12321.
9. S. C. Mannsfeld, B. C. Tee, R. M. Stoltenberg, C. V. H. Chen, S. Barman, B. V. Muir, A. N. Sokolov, C. Reese, Z. Bao, *Nature Mater.* 2010, 9, 859.
10. D. J. Lipomi, M. Vosgueritchian, B. C. Tee, S. L. Hellstrom, J. A. Lee, C. H. Fox, Z. Bao, *Nature Nanotech.* 2011, 6, 788.
11. G. Schwartz, B. C. K. Tee, J. Mei, A. L. Appleton, D. H. Kim, H. Wang, Z. Bao, *Nature Commun.* 2013, 4, 1859.
12. S. Bauer, *Nature Mater.* 2013, 12, 871.
13. S. Gong, W. Schwalb, Y. Wang, Y. Chen, Y. Tang, J. Si, B. Shirinzadeh, W. Cheng, *Nature Commun.* 2014, 5, 3132.

The haptic memory device may be achieved through the integration of resistive switching memory device and pressure sensor by employing the top electrode of a memory cell as the bottom electrode of a pressure sensor. As schematically illustrated in FIG. 5A, a haptic memory device may be modeled as a circuit arrangement including a resistive memory cell and a pressure sensor connected in series for each pixel. As elucidated previously, a resistive switching memory device may employ a metal-insulator-metal (MIM) architecture with $SiO_2$ as a memory layer, and switching of the memory layer may rely on the forming and dissolution of conductive silver (Ag) filaments.

Figure 8A:
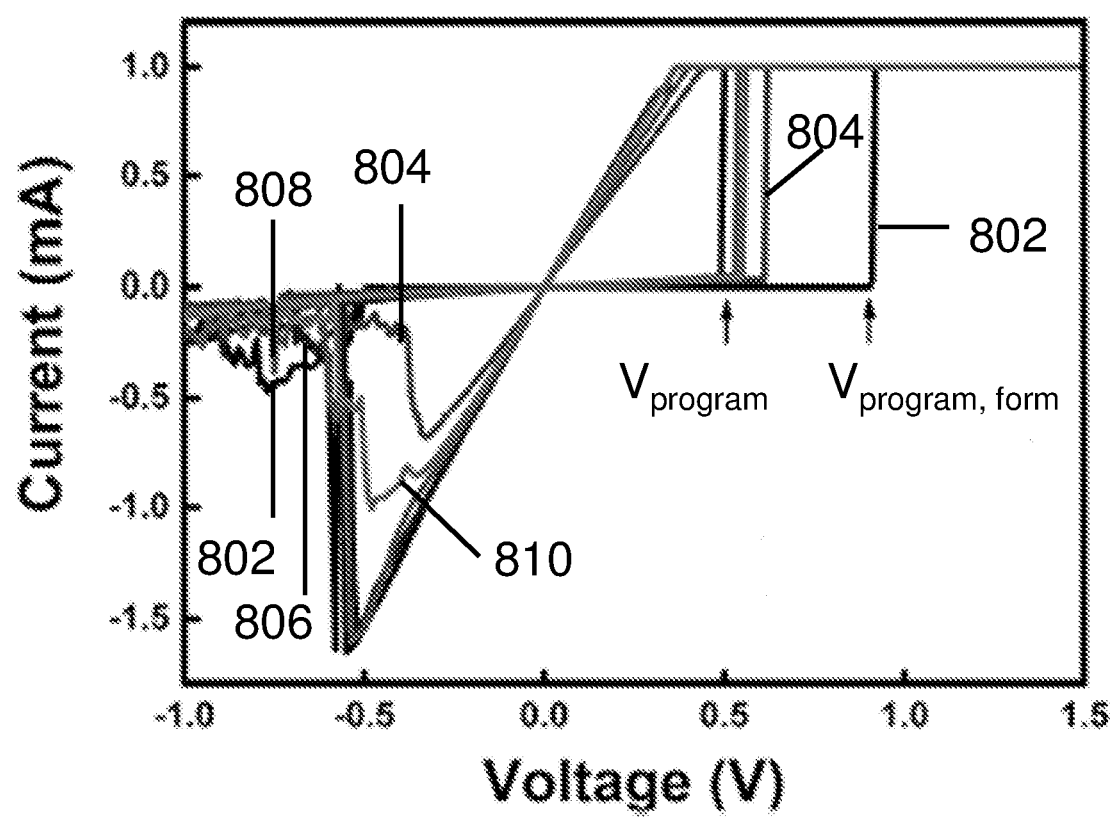
FIG. 8A is a plot of current (milli-amperes of mA) as a function of voltage (volts or V) showing the current-voltage switching cycles of a memory cell with silver/silicon oxide/gold ($Ag/SiO_2/Au$) structure according to various embodiments.

In a resistance switching cycle, a positive voltage ($V_{program}$) may be required to program a memory device from a high resistance state (HRS) to a low resistance state (LRS) to store pressure information, and a negative voltage ($V_{erase}$) to erase information stored, i.e., convert it from LRS back to HRS. FIG. 8A is a plot 800a of current (milliamperes of mA) as a function of voltage (volts or V) showing the current-voltage switching cycles of a memory cell with silver/silicon oxide/gold ($Ag/SiO_2/Au$) structure according to various embodiments. The initial programming voltage ($V_{program,form}$) to start the programming process (i.e., the forming cycle denoted by 802) may be obviously higher than the programming voltages for the following switching cycles 804, 806, 808, 810, illustrating that a memory cell may require an electroforming step to incorporate ions in the insulating $SiO_2$ film. 804 denotes the $1^{st}$ cycle, 806 denotes the $20^{th}$ cycle, 808 denotes the $50^{th}$ cycle, and 810 denotes the $100^{th}$ cycle.

Figure 8B:
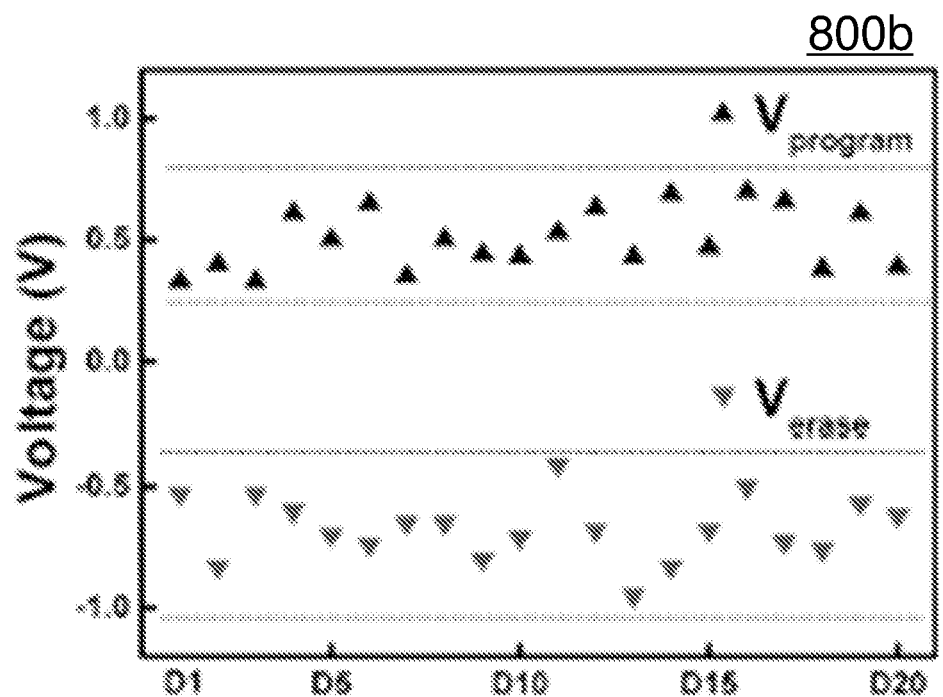
FIG. 8B is a plot of voltage (volts or V) as a function of device number showing the device-to-device distribution of programming voltage ($V_{program}$) and erasing voltage ($V_{erase}$) from switching cycles of 20 silicon oxide ($SiO_2$) based resistive switching memory devices according to various embodiments.
Figure 8C:
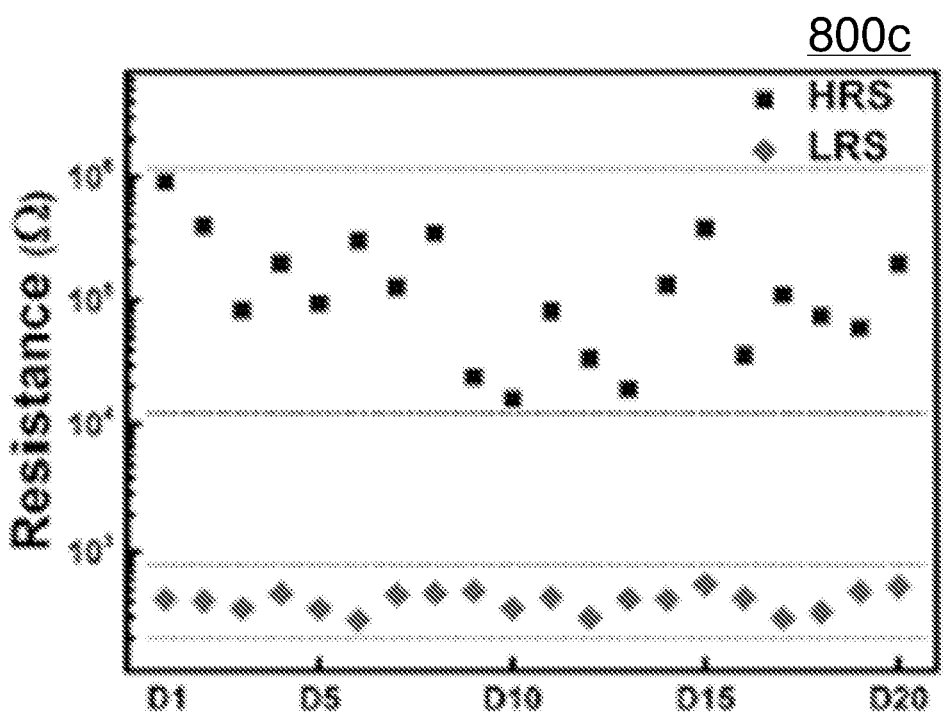
FIG. 8C is a plot of resistance (ohms or Ω) as a function of device number showing the device-to-device distribution of the high resistance state (HRS) resistance and the low resistance state (LRS) resistance of the 20 silicon oxide ($SiO_2$) based resistive switching memory devices according to various embodiments.

FIG. 8B is a plot 800b of voltage (volts or V) as a function of device number showing the device-to-device distribution of programming voltage ($V_{program}$) and erasing voltage ($V_{erase}$) from switching cycles of 20 silicon oxide ($SiO_2$) based resistive switching memory devices according to various embodiments. FIG. 8C is a plot 800c of resistance (ohms or $\Omega$) as a function of device number showing the device-to-device distribution of the high resistance state (HRS) resistance and the low resistance state (LRS) resistance of the 20 silicon oxide ($SiO_2$) based resistive switching memory devices according to various embodiments.

After integrating the resistive switching memory device with the AgNWs/PDMS based pressure sensor to form a haptic memory device, a switching cycle may be conducted by applying a voltage to the microstructured AgNWs/PDMS film under a direct current sweeping mode, and with the Au bottom electrode in the memory device grounded.

Figure 9A:
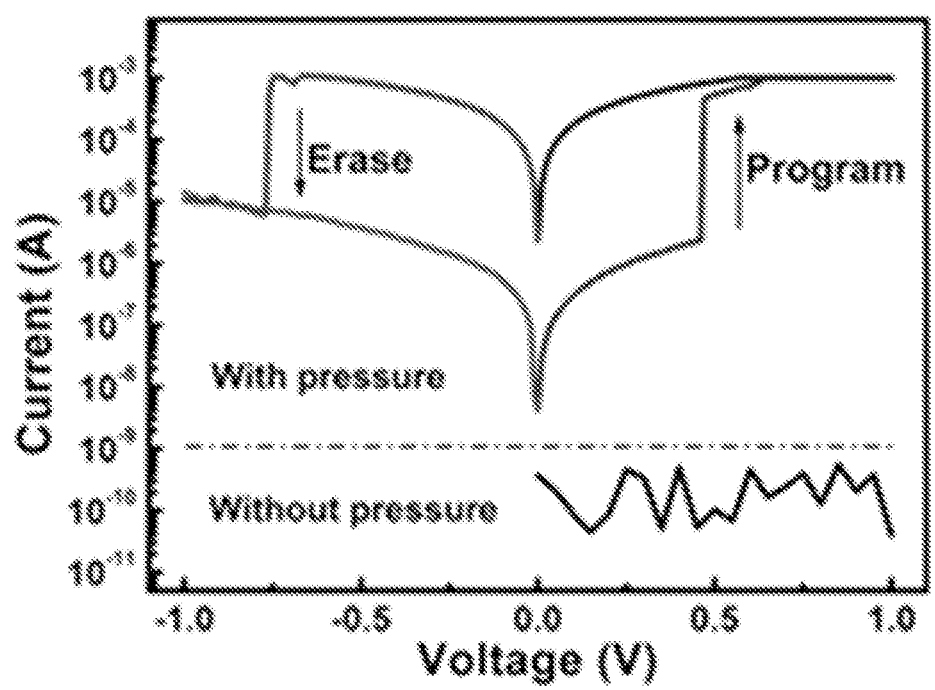
FIG. 9A is a plot of current (amperes or A) as a function of voltage (volts or V) showing a current-voltage curve of the device according to various embodiments when external pressure is applied and when external pressure is not applied.

FIG. 9A is a plot 900a of current (amperes or A) as a function of voltage (volts or V) showing a current-voltage curve of the device according to various embodiments when external pressure is applied and when external pressure is not applied. In various embodiments, the device may be programmed and erased only when an external pressure is applied. When no pressure is applied, the device may have a very high resistance because both the pressure sensor and the memory cell stay in the high resistance states, thus the current through the device may remains very low (<1 nA) with an applied voltage bias increasing in the range from about 0 V to about 1 V. When a pressure of 500 Pa is applied, the memory device may be switched from high resistance state (HRS) to low resistance state (LRS) by a voltage sweep from 0 to a positive programming voltage ($V_{program}$), with a compliance current of about 1 mA. A writing current may flow through the pressure sensor and the memory cell when a positive programming voltage is applied.

In the subsequent voltage sweep from about 1 V to about 0 V, the device may still retain LRS. The device may be switched back to HRS upon a voltage sweep from 0 to a negative erasing voltage ($V_{erase}$) in the presence of an applied pressure. When the negative erasing voltage is applied, an erasing current in an opposite direction of the writing current may flow through the pressure sensor and the memory cell. In this way, the memory cell may conduct "write" and "erase" operations in the presence of an external pressure. More noteworthy, the resistance state (i.e., LRS or HRS) may be recorded or stored in the memory cell even after the removal of applied pressure. The resistance state may be dynamically read under the application of pressure.

Figure 9B:
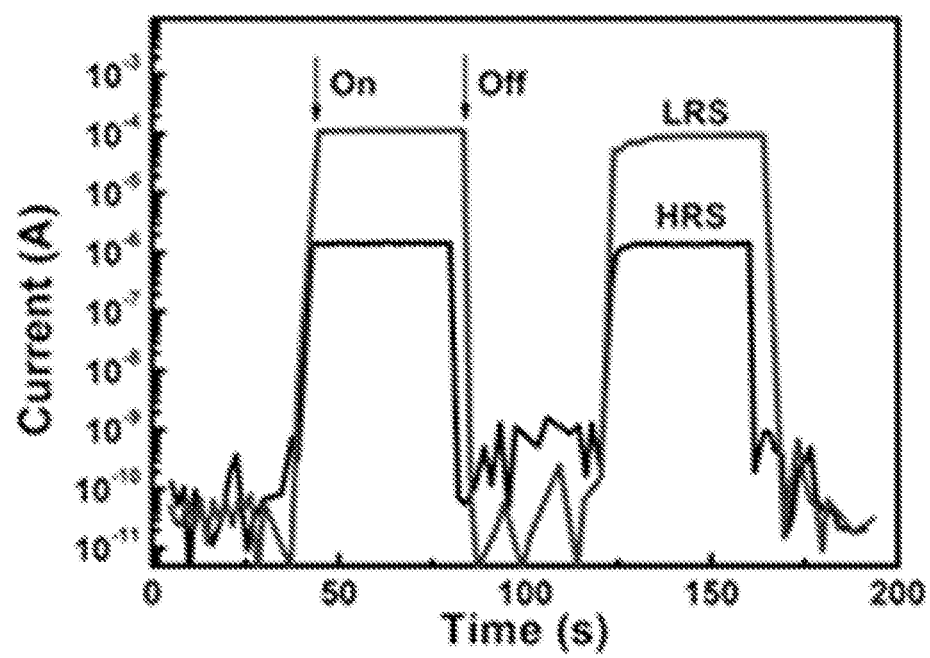
FIG. 9B is a plot of current (amperes or A) as a function of time (seconds or s) showing the instant current-time curves of the device according to various embodiments at different resistance states in response to an applied pressure of about 500 pascals (Pa) and a reading voltage of 50 millivolts (mV).

FIG. 9B is a plot 900b of current (amperes or A) as a function of time (seconds or s) showing the instant current-time curves of the device according to various embodiments at different resistance states in response to an applied pressure of about 500 pascals (Pa) and a reading voltage of 50 millivolts (mV). As shown in FIG. 9B, at a reading voltage of 50 mV, the current of an unprogrammed cell (HRS) may rise to about $10^{-6}$ A in the presence of an applied pressure, however a programmed cell (LRS) may rise to about $10^{-4}$ A in the presence of the applied pressure.

Figure 9C:
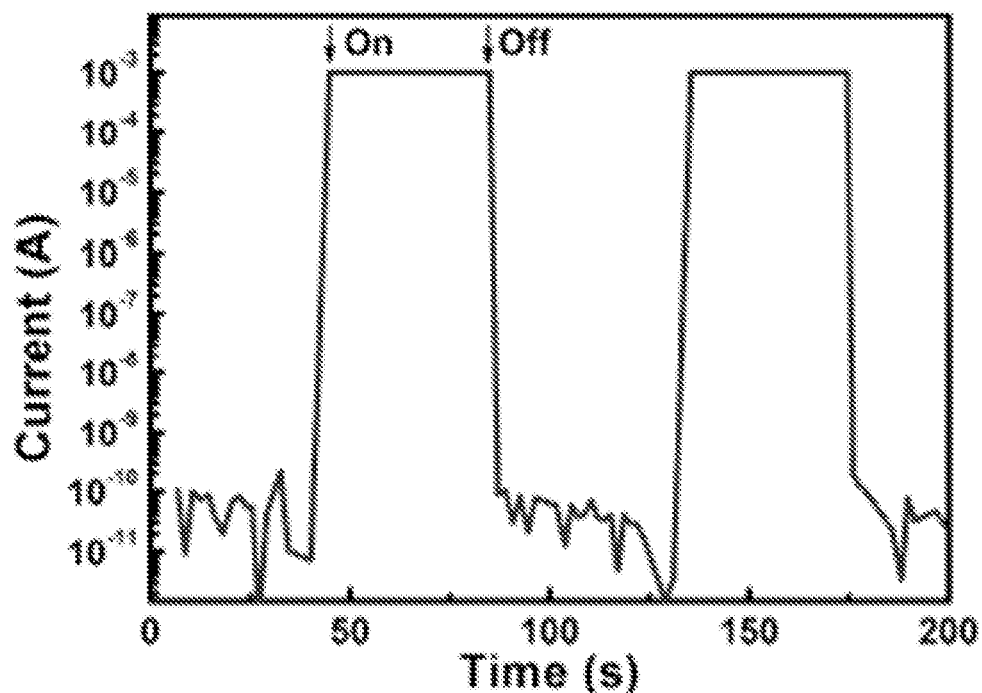
FIG. 9C is a plot of current (amperes or A) as a function of time (seconds or s) showing the instant current-time curve of the device according to various embodiments in response to an applied external pressure of about 500 pascals (Pa) at a voltage vias of about 1.5 volts (V).

Under a positive voltage (1.5 V) higher than $V_{program}$, the device may be programmed from HRS to LRS by external pressure, demonstrating capability of dynamic pressure sensing and memory. FIG. 9C is a plot 900c of current (amperes or A) as a function of time (seconds or s) showing the instant current-time curve of the device according to various embodiments in response to an applied external pressure of about 500 pascals (Pa) at a voltage vias of about 1.5 volts (V).

Figure 9D:
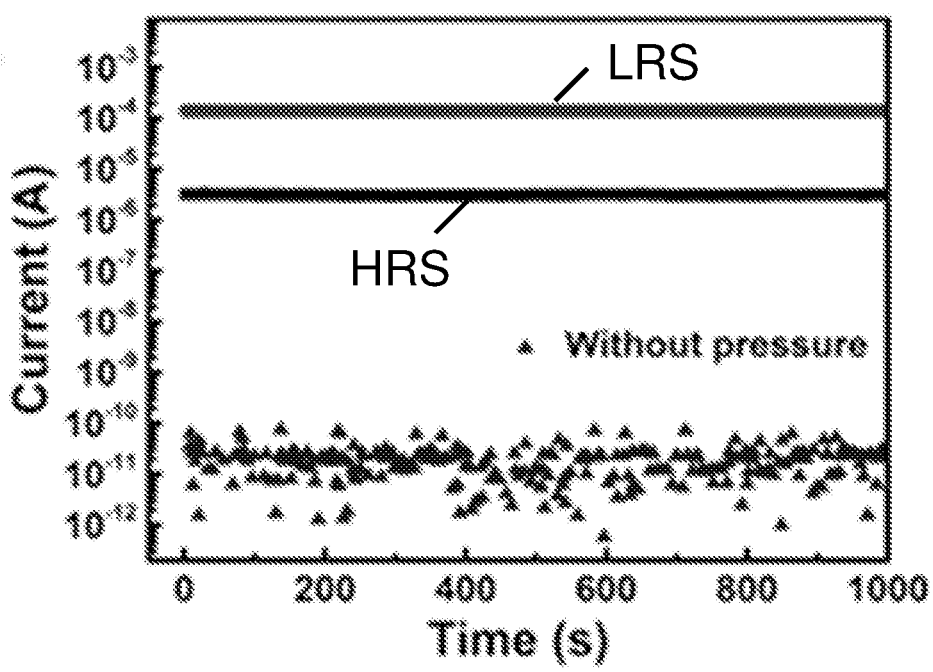
FIG. 9D is a plot of current (amperes or A) as a function of time (seconds or s) showing retention performance of the device according to various embodiments.
Figure 9E:
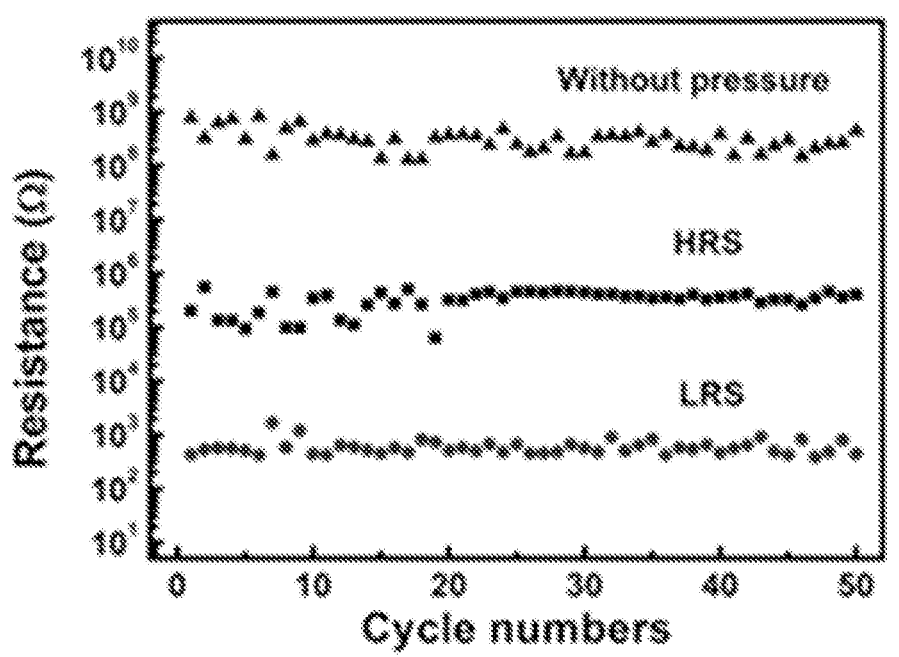
FIG. 9E is a plot of resistance (ohms or Ω) as a function of cycle numbers showing the endurance performance of the device according to various embodiments for 50 cycles.

FIG. 9D is a plot 900d of current (amperes or A) as a function of time (seconds or s) showing retention performance of the device according to various embodiments. The retention performance is characterized at a read voltage of about 50 mV, and resistances at both states show no changes for more than $10^3$ s. The endurance performance of the device is characterized by programming and erasing the device for 50 cycles in existence of pressure. FIG. 9E is a plot 900e of resistance (ohms or Ω) as a function of cycle numbers showing the endurance performance of the device according to various embodiments for 50 cycles. The resistance state may be read with a voltage of about 50 mV. The HRS and the LRS each shows little variation over the 50 cycles. The haptic memory device demonstrates good resistive switching behaviors in existence of pressure, thus providing a feasible way to record the application of pressure in the form of resistance states, and to realize the retention of pressure information after the release of the external pressure.

Figure 10A:
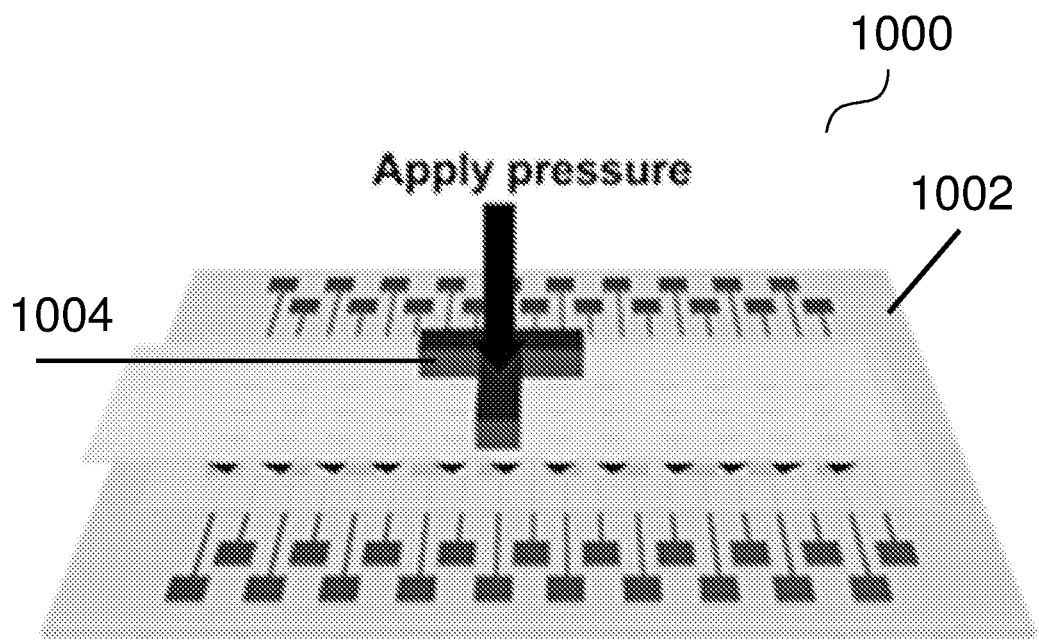
FIG. 10A is a schematic illustrating a setup for demonstrating a haptic memory device array according to various embodiments.
Figure 10B:
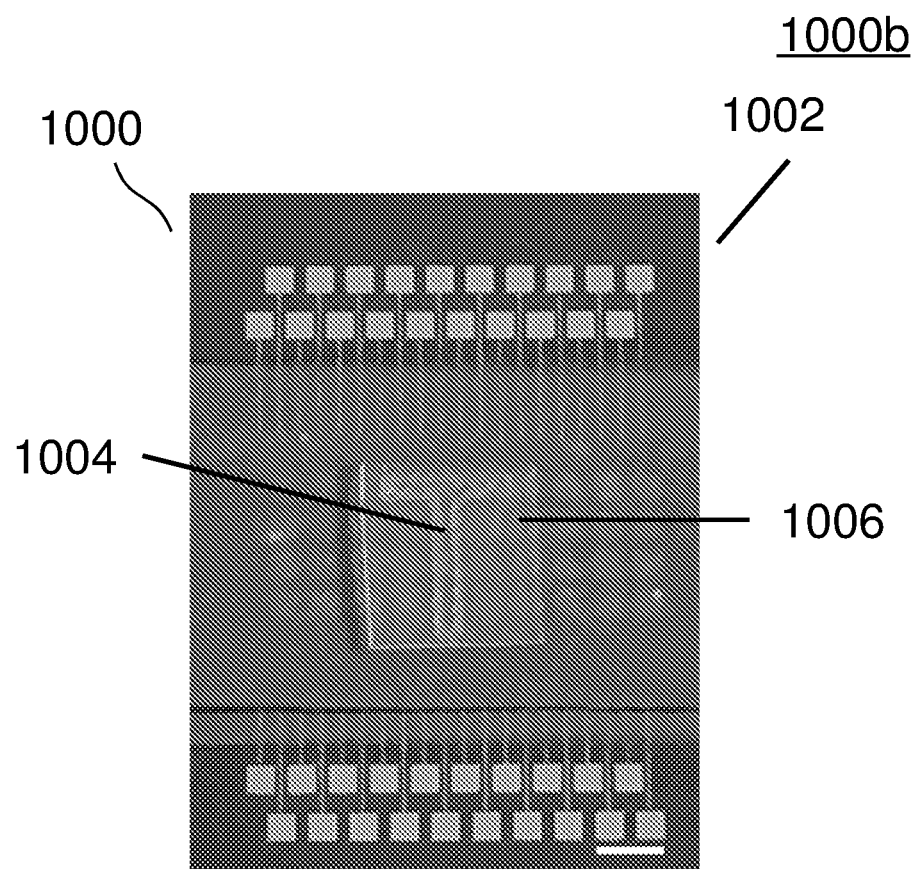
FIG. 10B shows a digital photo of a letter mold "T" on the top of device array according to various embodiments.

To demonstrate the capability of mapping and memorizing external pressure distribution after the pressure and voltage were removed, an array of 4×10 devices, each device represents one pixel, may be utilized to record the pressure applied through letter molds. FIG. 10A is a schematic illustrating a setup 1000 for demonstrating a haptic memory device array 1002 according to various embodiments. Letter molds 1004 made of SU-8 on polyethylene terephthalate (PET) film may be put or arranged on the top of the device array 1002. FIG. 10B shows a digital photo of a letter mold "T" 1004 on the top of device array 1002 according to various embodiments. A weight 1006 of 5 g may be applied on top of the PET film. The device array 1002 may record the external pressure applied via different letter molds 1004 of "N," "T," and "U."

Figure 10C:
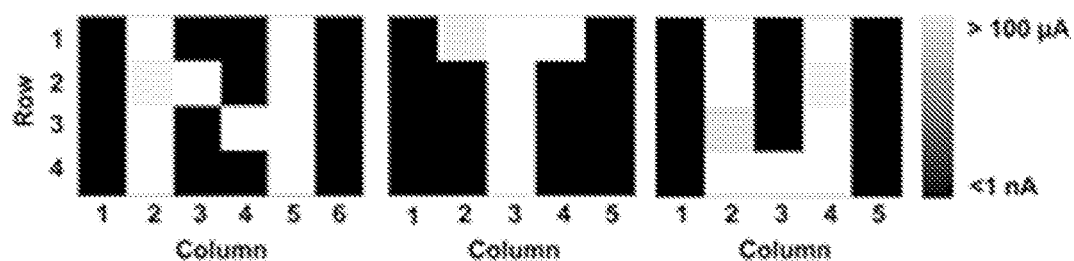
FIG. 10C shows images illustrating the mapping of letter molds of letters "N," "T" and "U" onto the device array 1002 according to various embodiments.
Figure 10D:
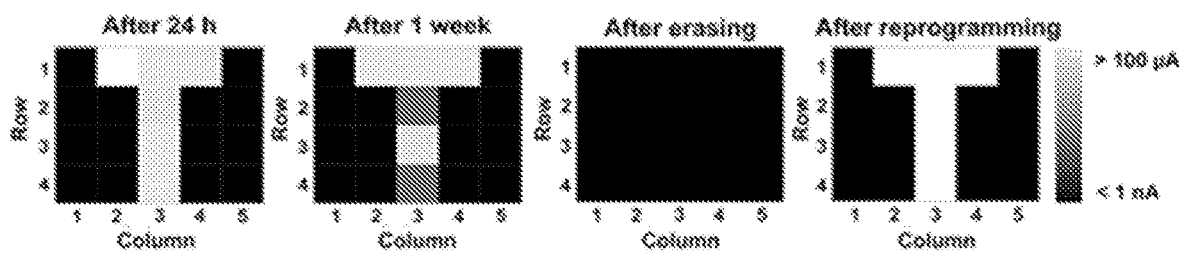
FIG. 10D show images illustrating the current mapping of the device array according to various embodiments in different stages and conditions.

FIG. 10C show images illustrating the mapping of letter molds 1004 of letters "N," "T" and "U" onto the device array 1002 according to various embodiments. As highlighted above, external pressure may be applied via the letter molds 1004 onto the device array 1002. A constant voltage may then be applied across each device of the device array 1002. The amount of current may then be determined to obtain the current mapping shown in FIG. 10C. As illustrated in FIG. 10C, only devices directly beneath the letter molds 1004 may be programmed to the low resistance state (LRS) by a positive voltage sweep from 0 to $V_{program}$ as only the devices directly beneath the letter molds 1004 are subjected to external pressure. In this way, an applied pressure distribution may not only be detected, but also be recorded in the memory arrays. FIG. 10D show images illustrating the current mapping of the device array 1002 according to various embodiments in different stages and conditions. As illustrated in FIG. 10D, the device array 1002 may retain the current mapping of "T" corresponding to the applied pressure distribution for a week with little decay. The pressure information stored in the device arrays may be easily erased to allow for multi-cycle usage.

Figure 11A:
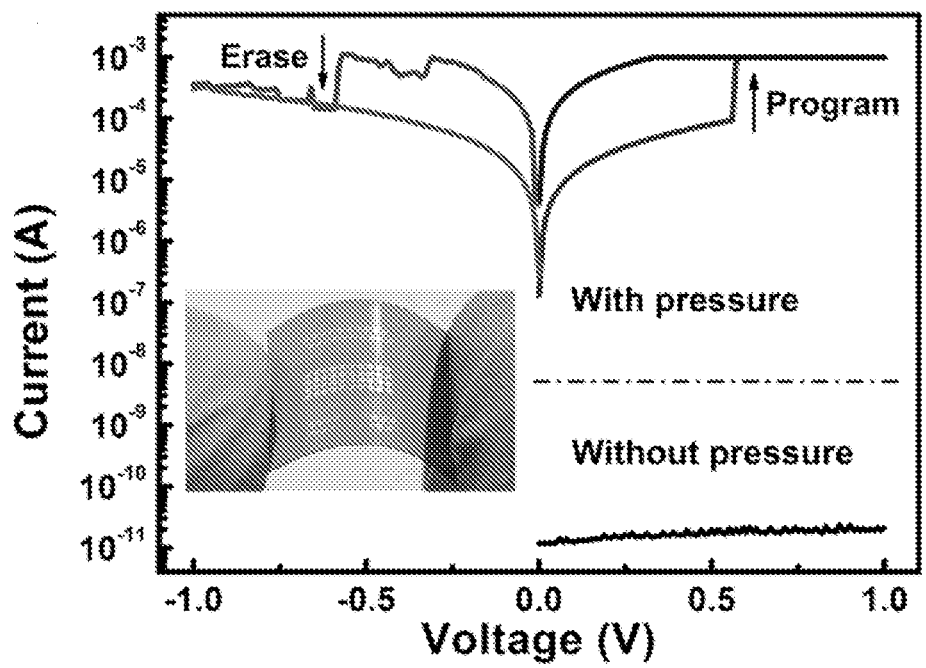
FIG. 11A is a plot of current (amperes or A) as a function of voltage (volts or V) showing current-voltage curves of the device fabricated on a polyimide film according to various embodiments under an applied pressure and not under an applied pressure.

Flexible sensing and memory devices may be required for future applications in E-skin and human-machine interface. Though the pressure sensors made of AgNWs/PDMS films may be soft, the rigid silicon substrate may limit the flexibility of the integrated devices. To solve this, the Ag/SiO$_2$/Au memory device array may be fabricated on flexible polyimide (PI) films (Kapton film of about 0.075 mm, DuPont) instead of a silicon wafer. FIG. 11A is a plot 1100a of current (amperes or A) as a function of voltage (volts or V) showing current-voltage curves of the device fabricated on a polyimide film according to various embodiments under an applied pressure and not under an applied pressure. The memory cell may only be programmed to LRS, i.e., switch from HRS to LRS, in the presence of applied pressure. As shown in FIG. 11A, the current of the device may remain quite low (less than about 1 nA) without pressure. The memory cell may be programmed to LRS by a positive voltage sweep from about 0V to about $V_{program}$ only when pressure (about 500 Pa) is applied on the device. The programmed device may be erased from the LRS to the HRS by a negative voltage sweep from about 0 volts to about $V_{erase}$ in the existence of an applied pressure.

Figure 11B:
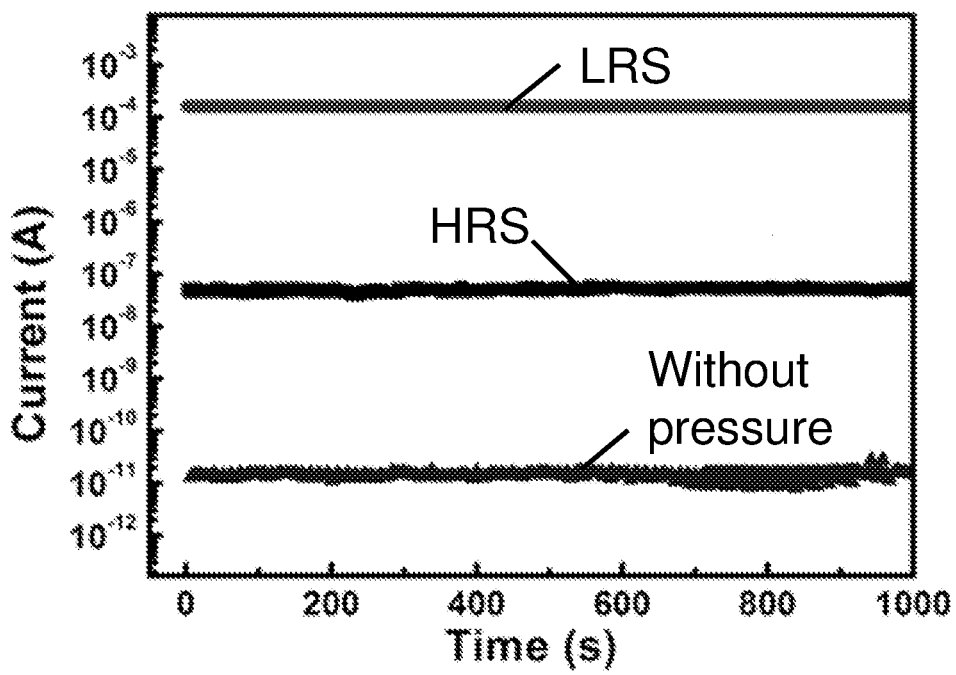
FIG. 11B is a plot of current (amperes or A) as a function of time (seconds or s) showing the retention performance of the device on polyimide film according to various embodiments.

FIG. 11B is a plot 1100b of current (amperes or A) as a function of time (seconds or s) showing the retention performance of the device on polyimide film according to various embodiments. The memory devices on PI films show good retention performance and no or little changes in either the HRS or LRS for about $10^3$ s.

Figure 11C:
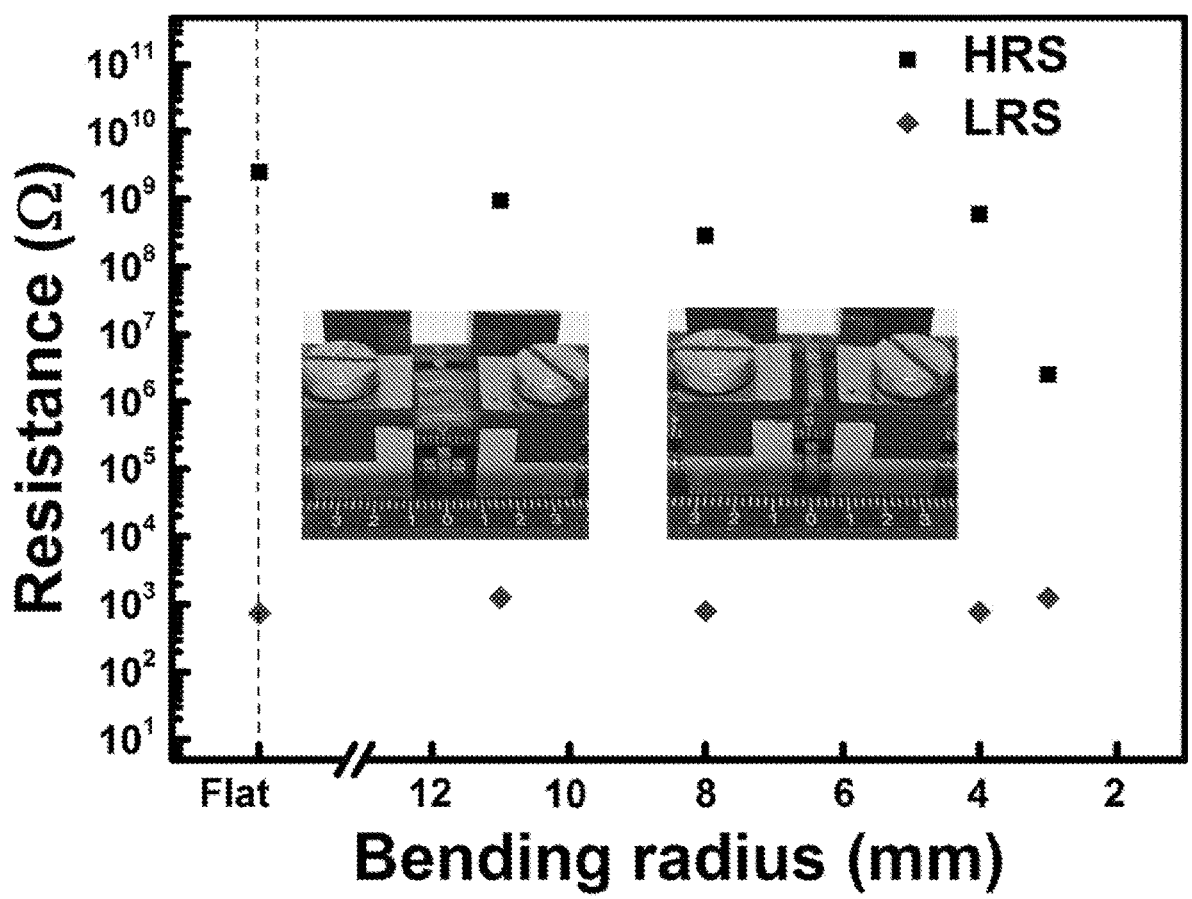
FIG. 11C is a plot of resistance (ohms or Ω) as a function of bending radius (millimeters or mm) showing the resistance values of the silicon oxide based memory device according to various embodiments at different states of different bending radiuses.

FIG. 11C is a plot 1100c of resistance (ohms or Ω) as a function of bending radius (millimeters or mm) showing the resistance values of the silicon oxide based memory device according to various embodiments at different states of different bending radiuses. The insets of FIG. 11C show photos of the device in a flat state and in a bent state. No significant variation of HRS and LRS was observed when bending radius is more than about 4 mm.

The pressure sensing and retention performance of the haptic memory device on flexible substrates may provide a feasible platform for practical applications in tactile sensing and memory. To demonstrate the function of sensing and retaining tactile information, a cross-bar memory array with a metal-insulator-metal (MIM) structure of Ag/SiO$_2$/Au on PI film has been fabricated. A haptic memory device of the array is connected to a light emitting diode (LED) in series to provide visualization of the resistance states. In this way, the different resistance states of the device may be visualized by the switching on and off of the LED. The lighting of the LED after pressing the haptic memory device with a finger may illustrate that the memory cell switches from FIRS ("0") to LRS ("1").

Figure 12A:
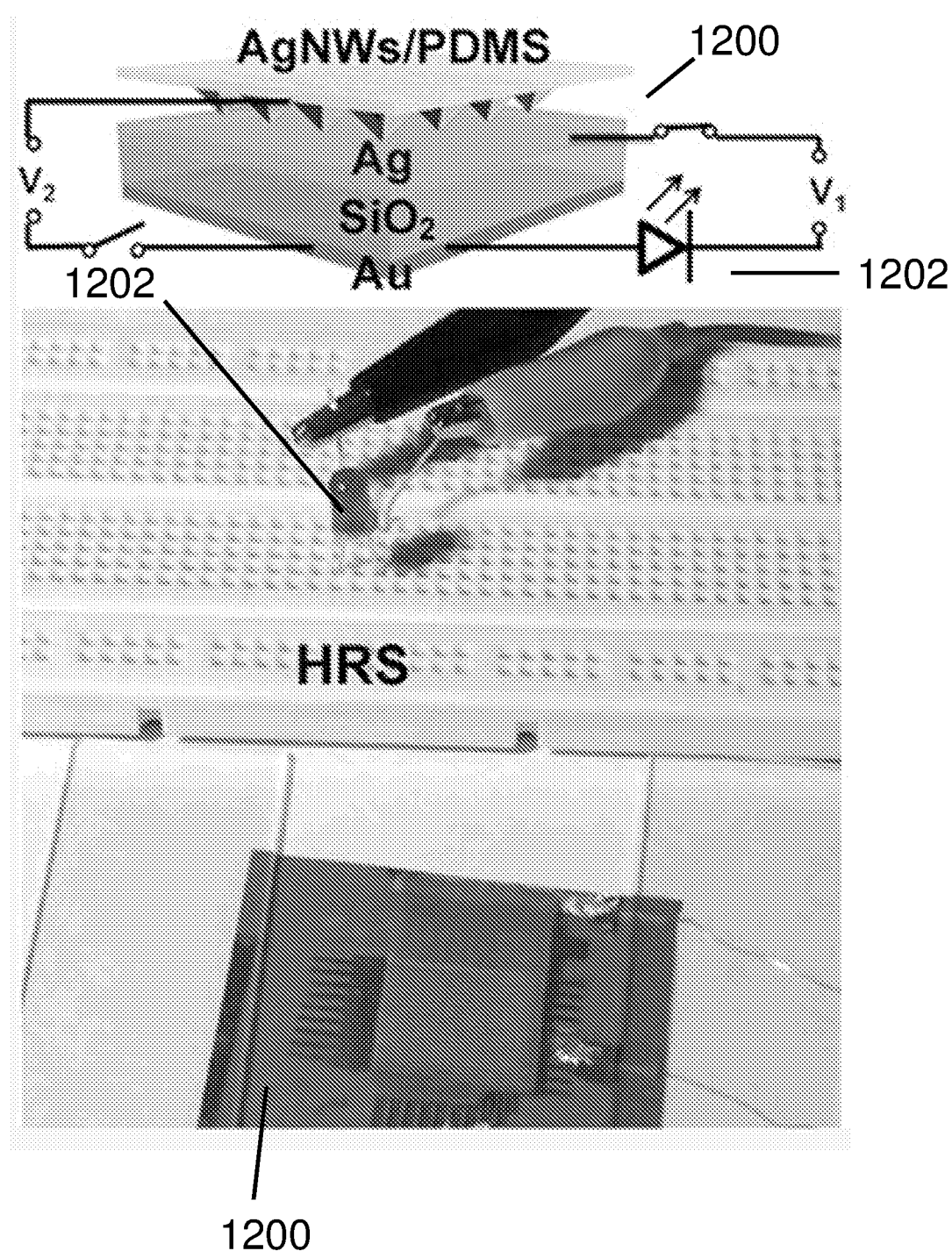
FIG. 12A shows a circuit arrangement including the haptic memory device according to various embodiments and the light emitting diode when a voltage bias ($V_1$) of about 2 volts is supplied to the haptic memory device and the light emitting diode.
Figure 12B:
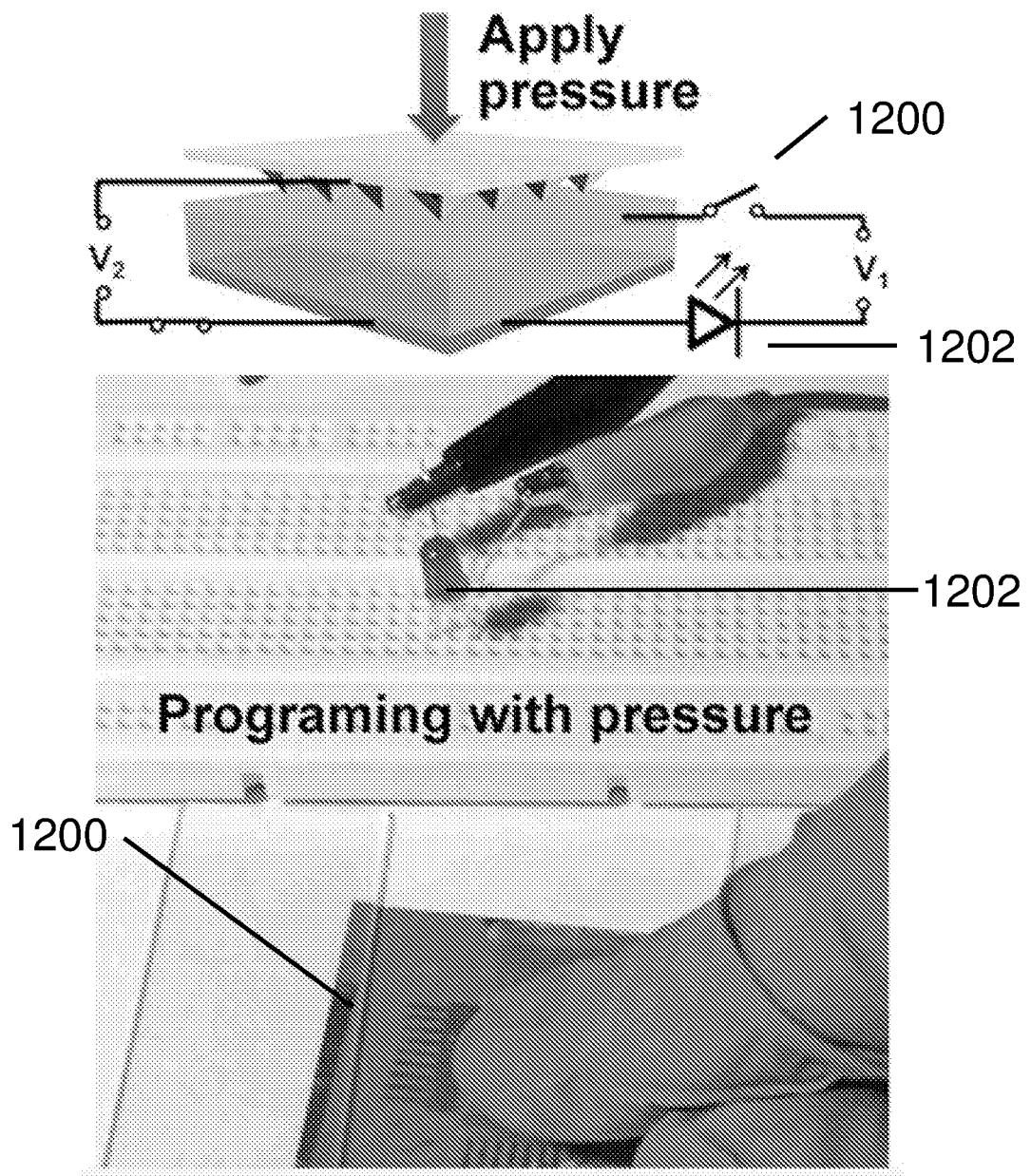
FIG. 12B shows a circuit arrangement including the haptic memory device according to various embodiments and the light emitting diode when another voltage bias ($V_2$) of about 2 volts is supplied to the haptic memory device and the light emitting diode, and pressure is applied by pressing a finger to the haptic memory device to program the haptic memory device from high resistance state (HRS) to low resistance state (LRS).

FIG. 12A shows a circuit arrangement including the haptic memory device 1200 according to various embodiments and the light emitting diode 1202 when a voltage bias ($V_1$) of about 2 volts is supplied to the haptic memory device 1200 and the light emitting diode 1202. The LED is not lighted as the memory device 1200 is in the high resistance state (HRS). FIG. 12B shows a circuit arrangement including the haptic memory device 1200 according to various embodiments and the light emitting diode 1202 when another voltage bias ($V_2$) of about 2 volts is supplied to the haptic memory device 1200 and the light emitting diode 1202, and pressure is applied by pressing a finger to the haptic memory device 1200 to program the haptic memory device 1200 from high resistance state (HRS) to low resistance state (LRS). A first end of the voltage supply $V_2$ is connected to the AgNWs/PDMS film and a second end is connected to a bottom gold electrode of the memory device.

Figure 12C:
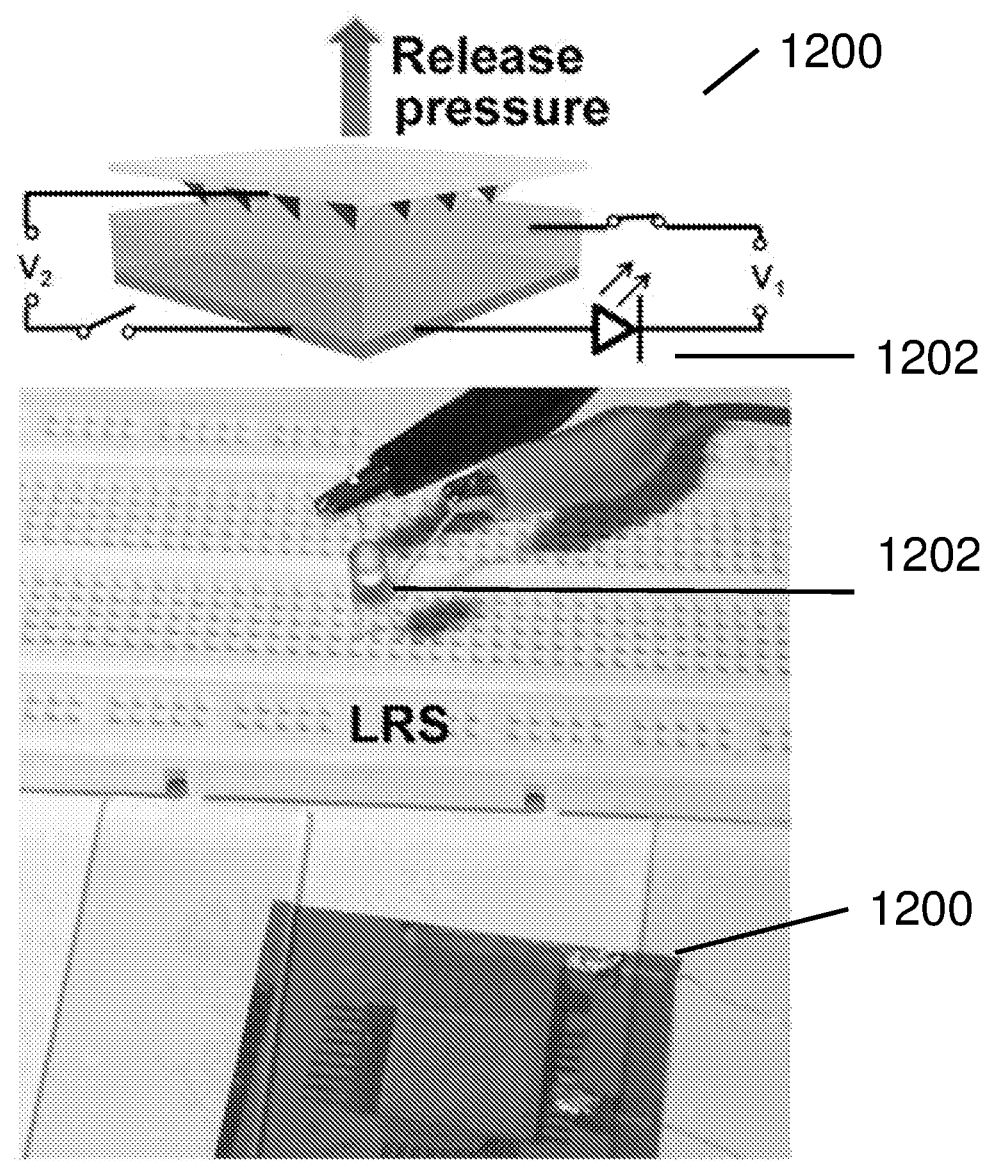
FIG. 12C shows a circuit arrangement including the haptic memory device according to various embodiments and the light emitting diode when the voltage bias ($V_1$) of about 2 volts is supplied again to the haptic memory device and the light emitting diode after removal of the finger.

FIG. 12C shows a circuit arrangement including the haptic memory device 1200 according to various embodiments and the light emitting diode 1202 when the voltage bias ($V_1$) of about 2 volts is supplied again to the haptic memory device 1200 and the light emitting diode 1202 after removal of the finger. The light emitting diode 1202 lights up as the haptic memory device 1200 is at the low resistance state (LRS). FIGS. 12A-C show that the haptic memory device 1200 is capable of retaining the tactile sensation information after external pressure ceased.

Various embodiments may provide a haptic memory device for realization of the detection and retention of tactile sensation for the mimicry of the human sensory memory. The haptic memory device may rely on the rational integration of a resistive switching memory device with a resistive pressure sensing device through a facile design of replacing the bottom electrode of the pressure sensing device with a top electrode of the resistive switching memory device. The resistive switching memory device may require a low operation voltage to switch between a HRS and a LRS. The haptic memory device may be electrically programmed by the resistance changes in the pressure sensor responding to the external pressure so as to "write" the pressure information in memory devices.

Pressure distribution may be detected and recorded by an array of haptic memory devices, and spatial resolution may be further improved by increasing the densities of device pixels to emulate the sensation of highly sensitive body sites like fingertips. The applied pressure distribution may be retained in the haptic memory devices for more than 1 week with little decay by virtue of the non-volatile performance of resistive switching memories. Also, the devices may be electrically reconfigured for sequential recordings of external applied pressures. Various embodiments may demonstrate the capability of memorizing the press of a finger, showing great potential for applications in sensing and retaining the tactile sensations. Various embodiments may provide a guide for designing or integrating future sensing devices and memory devices to mimic other sensory memory functions of humans such as iconic and echoic memory, thus opening new avenues for the advancement of next-generation high performance sensing systems for applications in electronic skins, humanoid robots as well as human-machine interfaces.

Various embodiments may provide an array of haptic memory devices capable of detecting external low-regime pressure distribution with high sensitivity and retaining the sensation information with a spatial resolution of about 400 µm. Various embodiments may demonstrate high sensitivity (about 1.3 $kPa^{-1}$ to about 24.8 $kPa^{-1}$) and fast response time (<4 ms). The high sensitivity and fast response time may be important criteria for designing tactile sensors in the applications of electronic skins and robotics. Various embodiments may require a low working voltage (about 1 V), and may thus reduce power consumption compared with previous tactile sensing devices based on organic field-effect transistors.

Various embodiments may provide a pressure sensing electronic device including a pressure sensor and a memory device connected in series. The resistance change in a pressure sensor induced by an external pressure may result in the a change in voltage on the electrode of a resistive switching memory cell, leading to a change in the resistance state of the resistive switching memory cell. The pressure information may be retained by the memory device.

The substrate may be rigid or flexible. The substrate may include inorganic, organic, or biological materials. The top and bottom electrode materials may include at least one selected from a group consisting of metals, admixture metals, conductive metal oxides, conductive polymers, and conductive carbon materials (e.g., graphene, carbon nanotubes). The electrodes may be formed using thermal evaporation, RF sputtering, printing, coating processes, et al. The resistive switching memory layer may include at least one selected from a group consisting of metal oxides, biomaterials (e.g., silk proteins), and carbon materials. The memory layer may be formed by RF sputtering, spin-coating, dip-coating, casting, and/or self-assembly methods. The pressure sensor may include any one structured configuration selected from a group consisting of pyramidal microstructures, conical microstructures, micro-/nano-pillars, microspheres, and nanowires. The pressure sensing layer may include at least one selected from a group consisting of metal nanowires, conducting polymers, carbon nanotubes and graphene.

Various embodiments may provide a new way to realize the detection and retention of tactile sensation for the mimicry of the human sensory memory, opening new avenues for the advancement of next-generation high performance sensing systems for applications in electronic skins, humanoid robots as well as human-machine interfaces.

EXPERIMENTAL SECTION

Device Fabrication:

Silicon masters with recessed pyramidal microstructure arrays were fabricated through photolithography and wet etching process. Microstructured AgNWs/PDMS films were prepared by depositing an aqueous solution of AgNWs (Blue Nano) on silicon masters and allowing this to dry in air, and then casting a mixture of PDMS elastomer and cross-linker in 10:1 (w/w) ratio (Sylgard 184, Dow Corning) through spin-coating (1000 rpm). The elastomer mixture was degassed in vacuum and cured at 90° C. for 1 h, then the films was sectioned by a scalpel and peeled off from the silicon master. The AgNWs were embedded in the top surface of the microstructured PDMS films and no leftovers were observed on the master after peeling off. The microstructured AgNWs/PDMS film is then placed face-to-face with an ITO/PET film (Sigma Aldrich) to form a resistive pressure sensor. Silver paint (RS Components Pte Ltd) and copper wires were used to connect to AgNWs/PDMS or ITO electrodes for characterization. $Au/SiO_2/Ag$ MIM memory devices were fabricated by patterning the bottom electrode arrays through photolithography and depositing a 5 nm Cr adhesive layer and a 50 nm Au films by thermal evaporation. Then $SiO_2$ memory layer was deposited on the Au bottom electrode arrays by RF sputtering (280 W, 5000 s, 5 mTorr Ar) with a shadow mask. The top electrode arrays were aligned above the bottom Au electrode arrays with mask aligner (SUSS MJB4 Mask Aligner, Garching) and fabricated by depositing a 50 nm Ag film. In the integrated device, AgNWs/PDMS was placed on the top Ag electrode arrays of the memory devices.

Device Characterization:

The morphologies of the microstructured AgNWs/PDMS and the memory device were characterized by field emission scanning electron microscopy (FESEM, JSM-7600F). Resistance and memory measurements were characterized by Keithley 4200 semiconductor characterization system. Pressure was applied and measured by a motorized vertical test stand (Mark-10 ESM301) in combination with a force gauge (Mark-10 M5-2) or by loading the system with standard weights. The size of the pressure sensor was 1 $cm^2$, and a light cover glass was placed upon the device to ensure homogeneous application of external pressure. Pressure sensing response time was recorded by an oscilloscope (Tektronix DPO5054B).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A pressure sensing electronic device comprising:
   a tactile sensor configured to determine an external pressure; and
   a haptic memory device electrically coupled to the tactile sensor, wherein:
   the haptic memory device is configured to switch from a first state to a second state upon the external pressure determined by the tactile sensor exceeding a predetermined threshold when a writing current flows through the tactile sensor and the haptic memory device;
   the haptic memory device comprises:
   a memory layer;
   a first electrode layer in contact with a first side of the memory layer; and
   a second electrode layer in contact with a second side of the memory layer opposite the first side of the memory layer; and
   the second electrode layer is also an electrode layer of the tactile sensor.

2. The electronic device according to claim 1, further comprising:
   an electrical source configured to apply the writing current through the tactile sensor and the haptic memory device.

3. The electronic device according to claim 1,
   wherein the tactile sensor is a resistive tactile sensor having a resistance based on the external pressure;
   wherein the resistive tactile sensor is configured so that the resistance of the resistive tactile sensor decreases upon application of the external pressure on the resistive tactile sensor, thereby causing an increase in the writing current through the resistive tactile sensor and the haptic memory device; and
   wherein the haptic memory device is configured to switch from the first state to the second state upon the writing current flowing through the resistive tactile sensor and the haptic memory device exceeding a predetermined value when the external pressure determined by the tactile sensor exceeds the predetermined threshold.

4. The electronic device according to claim 1, wherein:
   the memory layer comprises silicon oxide;
   the first electrode layer comprises gold; and
   the second electrode layer comprises silver.

5. The electronic device according to claim 1, wherein the tactile sensor comprises a pressure sensing layer in contact with the second electrode layer.

6. The electronic device according to claim 5, wherein the pressure sensing layer comprises a plurality of microstructures.

7. The electronic device according to claim 6, wherein the plurality of microstructures are pyramidal.

8. The electronic device according to claim 5, wherein the pressure sensing layer comprises any type of material selected from a group consisting of metal nanowires, conducting polymers, carbon nanotubes, graphene, and combinations thereof.

9. The electronic device according to claim 5, wherein the pressure sensing layer comprises a polydimethylsiloxane (PDMS) matrix, and silver nanowires embedded in the polydimethylsiloxane (PDMS) matrix.

10. The electronic device according to claim 1, wherein the memory layer comprises any type of material selected from a group consisting of metal oxides, semiconductor oxides, biomaterials, carbon materials, and combination thereof.

11. A method of forming a pressure sensing electronic device, the method comprising:
    forming a tactile sensor configured to determine an external pressure; and
    forming a haptic memory device electrically coupled to the tactile sensor, wherein:
    the haptic memory device is configured to switch from a first state to a second state upon the external pressure determined by the tactile sensor exceeding a predetermined threshold when a writing current flows through the tactile sensor and the haptic memory device;
    the haptic memory device comprises:
    a memory layer;
    a first electrode layer in contact with a first side of the memory layer; and
    a second electrode layer in contact with a second side of the memory layer opposite the first side of the memory layer; and
    the second electrode layer is also an electrode layer of the tactile sensor.

12. The method according to claim 11, wherein forming the haptic memory device comprises:
    forming the first electrode layer;
    forming the memory layer on the first electrode layer; and
    forming the second electrode layer on the memory layer.

13. The method according to claim 11,
    wherein forming the tactile sensor comprises forming a pressure sensing layer on the second electrode layer.

14. A method of operating a pressure sensing electronic device, the method comprising:
    applying an external pressure to a tactile sensor comprised in the pressure sensing device, the tactile sensor configured to determine the external pressure; and
    applying a writing current to the electronic device comprising the tactile sensor and a haptic memory device electrically coupled to the tactile sensor so that the haptic memory device switches from a first state to a second state upon the external pressure determined by the tactile sensor exceeding a predetermined threshold, wherein:
    the haptic memory device comprises:
    a memory layer;
    a first electrode layer in contact with a first side of the memory layer; and
    a second electrode layer in contact with a second side of the memory layer opposite the first side of the memory layer; and
    the second electrode layer is also an electrode layer of the tactile sensor.

15. The method according to claim 14,
    wherein the tactile sensor is a resistive tactile sensor having a resistance based on the external pressure;
    wherein the resistive tactile sensor is configured so that the resistance of the resistive tactile sensor decreases upon application of the external pressure on the resistive tactile sensor, thereby causing an increase in the writing current through the resistive tactile sensor and the haptic memory device; and wherein the haptic memory device is configured to switch from the first state to the second state upon the writing current flowing through the resistive tactile sensor and the haptic memory device exceeding a predetermined value when the external pressure determined by the tactile sensor exceeds the predetermined threshold.

16. The method according to claim 14, wherein the haptic memory device has a higher resistance in the first state than in the second state.

17. The method according to claim 14, further comprising:

applying an erasing current in a direction opposite a direction of the writing current to switch from the second state to the first state.

18. The method according to claim 14, wherein the haptic memory device is configured to be in the second state when the external pressure is removed after applying the external pressure.

* * * * *